(12) United States Patent
Gardner et al.

(10) Patent No.: US 11,652,139 B2
(45) Date of Patent: May 16, 2023

(54) THREE-DIMENSIONAL UNIVERSAL CMOS DEVICE

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 75 days.

(21) Appl. No.: 17/328,601

(22) Filed: May 24, 2021

(65) Prior Publication Data

US 2022/0102492 A1    Mar. 31, 2022

Related U.S. Application Data

(60) Provisional application No. 63/085,616, filed on Sep. 30, 2020.

(51) Int. Cl.
*H01L 29/06* (2006.01)
*H01L 21/8238* (2006.01)

(52) U.S. Cl.
CPC .. *H01L 29/0653* (2013.01); *H01L 21/823807* (2013.01); *H01L 21/823814* (2013.01); *H01L 21/823878* (2013.01)

(58) Field of Classification Search
CPC ......... H01L 29/0653; H01L 21/823807; H01L 21/823814; H01L 21/823878; H01L 21/8221; H01L 21/823842; H01L 21/823885; H01L 27/0688; H01L 27/092; H01L 29/66545; H01L 29/66666; H01L 29/78642
See application file for complete search history.

(56) References Cited

U.S. PATENT DOCUMENTS

| | | | | |
|---|---|---|---|---|
| 2008/0067495 | A1* | 3/2008 | Verhulst | H01L 29/7391 257/E21.409 |
| 2016/0197146 | A1* | 7/2016 | Augusto | H01L 29/0649 257/22 |
| 2018/0083136 | A1* | 3/2018 | Xie | H01L 29/66666 |
| 2018/0342614 | A1* | 11/2018 | Bergendahl | H01L 29/7827 |

* cited by examiner

*Primary Examiner* — Karen Kusumakar
*Assistant Examiner* — Adam S Bowen
(74) *Attorney, Agent, or Firm* — Oblon, McClelland, Maier & Neustadt, L.L.P.

(57) ABSTRACT

A semiconductor device includes a first universal device formed over a substrate, an isolation structure over the first universal device, and a second universal device over the isolation structure. The first universal device includes a first source/drain (S/D) region formed over the substrate, a first channel region over the first S/D region, a second S/D region over the first channel region. The second universal device includes a third S/D region positioned over the isolation structure, a second channel region over the third S/D region, a fourth S/D region over the second channel region. The first universal device is one of a first n-type transistor according to first applied bias voltages, and a first p-type transistor according to second applied bias voltages. The second universal device is one of a second n-type transistor according to third applied bias voltages, and a second p-type transistor according to fourth applied bias voltages.

19 Claims, 18 Drawing Sheets

THREE-DIMENSIONAL UNIVERSAL CMOS DEVICE

CROSS REFERENCE TO RELATED APPLICATIONS

This present application claims the benefit of priority to U.S. Provisional Application No. 63/085,616 filed on Sep. 30, 2020, which is incorporated by reference herein in its entirety.

FIELD OF THE INVENTION

The disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY 3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Techniques herein include 3D upright transistor architecture, as well as method of making the same, which enables each device to be used with unified device either as a NMOS or a PMOS device. Embodiments herein are compatible with any existing logic circuit layout, which can further increase circuit layout and packing density. Techniques herein can modulate channel to match drive currents for circuit tuning. Precise control of the channel length can be achieved below 10A precision because of deposition method used. In the present disclosure, both universal 3D devices and methods for fabricating the universal 3D devices are provided. Universal 3D device flows herein provide low subthreshold slope and robust off state leakage current.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The semiconductor device can include a first universal device formed over a substrate, where the first universal device can include a first source/drain (S/D) region formed over the substrate, a first channel region over the first S/D region, a second S/D region over the first channel region, and a first gate structure positioned between the first S/D region and the second S/D region and around the first channel region. The semiconductor device also includes an isolation structure positioned over the first universal device, where the isolation structure can further extend along a top surface of the substrate. The semiconductor device can have a second universal device formed over the isolation structure and spaced apart from the first universal device by the isolation structure. The second universal device can include a third S/D region positioned over the isolation structure, a second channel region over the third S/D region, a fourth S/D region over the second channel region, and a second gate structure positioned between the third S/D region and the fourth S/D region and around the second channel region. In the semiconductor device, the first universal device can be one of a first n-type transistor according to first applied bias voltages, and a first p-type transistor according to second applied bias voltages. The second universal device can be one of a second n-type transistor according to third applied bias voltages, and a second p-type transistor according to fourth applied bias voltages.

In the semiconductor device, the first channel region can further be positioned parallel to the top surface of the substrate such that a first current flowing through the first channel region is perpendicular to the top surface of the substrate, and the second channel region can further be positioned parallel to the top surface of the substrate such that a second current flowing through the second channel region is perpendicular to the top surface of the substrate.

In some embodiments, the first S/D region and the third S/D region can be made of a same n-type epitaxial material, the second S/D region and the fourth S/D region can be made of a same p-type epitaxial material, and the first channel region and the second channel region can be made of a same intrinsic epitaxial material.

In some embodiments, the first gate structure can include a first high-k layer positioned around the first channel region, a first transition stack positioned over the first high-k layer and around the first channel region, and a first metal stack disposed over the first transition stack and around the first channel region. The second gate structure can include a second high-k layer positioned around the second channel region, a second transition stack positioned over the second high-k layer and around the second channel region, and a second metal stack disposed over the second transition stack and around the second channel region. The first high-k layer and the second high-k layer can be made of a same high-k material, the first transition stack and the second transition stack can be made of same transition layers, and the first metal stack the second metal stack can be made of different metal layers.

In some embodiments, the first gate structure can include a first high-k layer positioned around the first channel region, a first transition stack positioned over the first high-k layer and around the first channel region, and a first metal stack disposed over the first transition stack and around the first channel region. The second gate structure can include a second high-k layer positioned around the second channel region, a second transition stack positioned over the second high-k layer and around the second channel region, and a second metal stack disposed over the second transition stack and around the second channel region. The first high-k layer and the second high-k layer can be made of a same high-k material, the first transition stack and the second transition stack can be made of same transition layers, and the first metal stack the second metal stack can be made of same metal layers.

According to another aspect of the disclosure, a semiconductor device is provided. The semiconductor device can include a universal device formed over a substrate, where the universal device can include a first source/drain (S/D) region formed over the substrate, a first channel region over the first S/D region, a second S/D region over the first channel region, and a first gate structure positioned between the first S/D region and the second S/D region and around the first channel region. The semiconductor device can include a transistor formed over the universal device, where the transistor can include a third S/D region positioned over the universal device, a second channel region over the third S/D region, a fourth S/D region over the second channel region, and a second gate structure positioned between the third S/D region and the fourth S/D region and around the second channel region. In the semiconductor device, the universal device can be one of a n-type transistor according to first applied bias voltages, and a p-type transistor according to second applied bias voltages.

The semiconductor device can further include an isolation structure positioned between the universal device and the transistor so that the universal device and the transistor are spaced part from each other by the isolation structure.

In some embodiments, the first S/D region can be made of a n-type epitaxial material, the second S/D region, the third S/D region, and the fourth S/D region can be made of a same p-type epitaxial material, and the first channel region and the second channel region can be made of a same intrinsic epitaxial material.

In some embodiments, the first S/D region can be made of a p-type epitaxial material, the second S/D region, the third S/D region, and the fourth S/D region are made of a same n-type epitaxial material, and the first channel region and the second channel region are made of a same intrinsic epitaxial material.

In the semiconductor device, the first gate structure can include a first high-k layer positioned around the first channel region, a first transition stack positioned over the first high-k layer and around the first channel region, and a first metal stack disposed over the first transition stack and around the first channel region. The second gate structure can include a second high-k layer positioned around the second channel region, a second transition stack positioned over the second high-k layer and around the second channel region, and a second metal stack disposed over the second transition stack and around the second channel region. The first high-k layer and the second high-k layer can be made of a same high-k material, the first transition stack and the second transition stack can be made of same transition layers, and the first metal stack the second metal stack can be made of different metal layers.

According to another aspect of the disclosure, a semiconductor device is provided. The semiconductor device can include a first universal device formed over a substrate, where the first universal device can include a first source/drain (S/D) region over the substrate, a first channel region over the first S/D region, a second S/D region over the first channel region, and a first gate structure positioned between the first S/D region and the second S/D region and around the first channel region. The semiconductor device can include an isolation structure that is positioned over the first universal device, and further extends along a top surface of the substrate. The semiconductor device can include a second universal device formed over the isolation structure and spaced apart from the first universal device by the isolation structure. The second universal device can include a third S/D region over the isolation structure, a second channel region over the third S/D region, a fourth S/D region over the second channel region, and a second gate structure positioned between the third S/D region and the fourth S/D region and around the second channel region. In the semiconductor device, a salicide layer can be positioned between the first gate structure and the second gate structure and further around the second S/D region and the third S/D region so that the second S/D region can be coupled to the third S/D region. The first universal device can be one of a first n-type transistor according to first applied bias voltages, and a first p-type transistor according to second applied bias voltages. The second universal device can be one of a second n-type transistor according to third applied bias voltages, and a second p-type transistor according to fourth applied bias voltages.

In some embodiments, the first S/D region and the third S/D region can be made of a same n-type epitaxial material, and the second S/D region and the fourth S/D region can be made of a same p-type epitaxial material.

In some embodiments, the first channel region can be made of a first intrinsic epitaxial material, and the second channel region can be made of a second intrinsic epitaxial material.

In the semiconductor device, the first gate structure can includes a first high-k layer positioned around the first channel region, a first transition stack positioned over the first high-k layer and around the first channel region, and a first metal stack disposed over the first transition stack and around the first channel region. In addition, the second gate structure can include a second high-k layer positioned around the second channel region, a second transition stack positioned over the second high-k layer and around the second channel region, and a second metal stack disposed over the second transition stack and around the second channel region. The first high-k layer and the second high-k layer can be made of a same high-k material, the first transition stack and the second transition stack can be made of same transition layers, and the first metal stack the second metal stack can be made of different metal layers.

According to yet another aspect of the disclosure, a method of manufacturing a semiconductor device is provided. In the method, a stack of dielectric layers can be formed on a first layer of a semiconductor substrate, where the stack of dielectric layers can include layers made of at least three different dielectric materials with respective etch selectivity, and an intermediate layer of the layers can be made of one of the at least three different dielectric materials and disposed in a middle position of the stack of dielectric layers. An opening can be formed in the stack of dielectric layers such that the first layer of the semiconductor substrate is uncovered. A channel material stack can be epitaxially grown within the opening to form a vertical channel that extends from the first layer of the semiconductor substrate. The stack of dielectric layers can be etched to form a sidewall structure disposed along sidewalls of the vertical channel, where the sidewall structure can be formed of the layers of the at least three different dielectric materials. The vertical channel can further be divided into a lower channel and an upper channel that are isolated from one another. A lower universal device can subsequently be formed based on the lower channel and an upper universal device can be formed based on the upper channel. The lower universal device can be one of a first n-type transistor according to first bias voltages, and a first p-type transistor according to second bias voltages, and the upper universal device can be one of a second n-type transistor according to third bias voltages, and a second p-type transistor according to fourth bias voltages.

In order to epitaxially grow the channel material stack, a first source/drain (S/D) region can be formed over the first layer of the semiconductor substrate. A first channel region can be formed over the first S/D region. A second S/D region can be formed over the first channel region. An intrinsic layer can be formed over the second S/D region, where the intrinsic layer can be surrounded by the intermediate layer. Further, a third S/D region can be formed over the intrinsic layer. A second channel region can be formed over the third S/D region, and a fourth S/D region can be formed over the second channel region.

In order to etch the stack of dielectric layers, a trench can be formed in the stack of dielectric layers around the vertical channel. The trench can uncover the first layer of the semiconductor substrate and form the sidewall structure disposed along the sidewalls of the vertical channel, and the vertical channel can be surrounded by the sidewall structure.

In order to divide the vertical channel, an isolation structure can be formed by replacing the intermediate layer with the isolation structure in the sidewall structure. The isolation structure can further extend through the intrinsic layer of the vertical channel to separate the vertical channel into the lower channel and the upper channel. Accordingly, the lower channel can includes the first S/D region, the first channel region, and the second S/D region, and the upper channel can include the third S/D region, the second channel region, and the fourth S/D region.

In order to form the lower universal device based on the lower channel and the upper universal device based on the upper channel, a first dielectric layer of the layers that is disposed around the first channel region can be removed. In addition, a second dielectric layer of the layers that is disposed around the second channel region can be removed. A first gate structure can be formed around the first channel region, where the first gate structure can include a first high-k layer around the first channel region, a first transition stack over the first high-k layer and around the first channel region, and a first metal stack over the first transition stack and around the first channel region. A second gate structure can be formed around the second channel region, where the second gate structure can include a second high-k layer around the second channel region, a second transition stack over the second high-k layer and around the second channel region, and a second metal stack over the second transition stack and around the second channel region. The first high-k layer and the second high-k layer can be made of a same high-k material, the first transition stack and the second transition stack can be made of same transition layers, and the first metal stack the second metal stack can be made of different metal layers.

In the method, the first S/D region and the third S/D region can be made of a same n-type epitaxial material, the second S/D region and the fourth S/D region can be made of a same p-type epitaxial material, and the first channel region and the second channel region can be made of a same intrinsic epitaxial material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
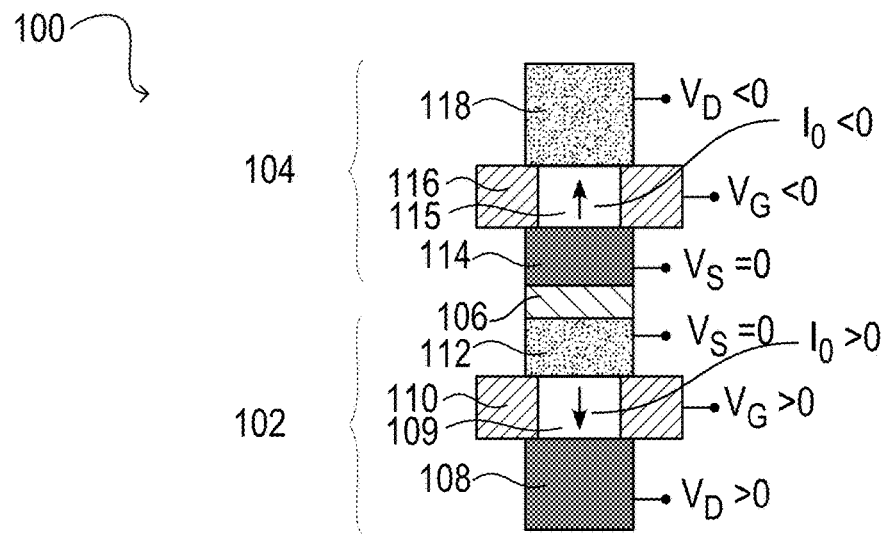
FIG. 1 is a schematic view of a vertical stack of two universal devices, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques herein include 3D upright transistor architecture including universal 3D devices, as well as method of making the same, that enables each universal device in the 3D upright transistor architecture to be used either as a NMOS device or a PMOS device according to applied biases. Embodiments herein are compatible with any existing logic circuit layout, which can further increase circuit layout and packing density. Techniques herein can modulate channels of the devices to match drive currents for circuit tuning. Precise control of the channel length can be achieved below 10A precision because of the deposition method used. In the present disclosure, methods to form the universal 3D devices and structures of universal 3D devices are provided. The universal 3D device herein can provide a low subthreshold slope and a robust off state leakage current. Although techniques herein can be applied to many different devices. For simplicity and clarity, exemplary embodiments are provided based on a 3D inverter structure.

Embodiments can be described with several manufacturing flows. Flow A describes two universal 3D devices that are stacked and separated by a 3D isolation, where the two universal 3D devices can be used as either a NMOS device type or a PMOS device type. Flow B illustrates two devices that are stacked over one another and can include one universal device with one or more NMOS or PMOS devices separated by a 3D isolation. Note that the two devices can also be stacked without the 3D isolation. In flow C, a 3D inverter with a 3D isolation is illustrated using universal 3D devices but defining the device type with electrical hookup. As can be appreciated, flows mentioned above may be combined on different types of circuits to cover all device and method claims.

FIGS. 1-12 illustrate various intermediate steps of the flow A that describes two universal 3D devices separated by a 3D isolation, where the two universal 3D devices can be used as either a NMOS device type or a PMOS device type. Embodiments herein can enable the 3D upright transistor architecture that includes universal 3D devices to be used either as a NMOS device or a PMOS device.

FIG. 1 shows a biasing scheme 100 applied on a PMOS (or P-type) universal device 104 stacked over an NMOS (or N-type) universal device 102. Note that the source/drain (S/D) and the channel stack are same for both the NMOS universal device 102 and the PMOS universal device 104, but gate electrodes (or gate structures) of the PMOS universal device 104 and the NMOS universal device 102 can be different. Thus, the gate electrodes can establish the device type. Also it is noted that gate electrode regions in FIG. 1 are shown larger than an actual electrical hookup.

As shown in FIG. 1, the PMOS universal device 104 can be spaced apart from the NMOS universal device 102 by an isolation structure 106. The NMOS universal device 102 can include a first source/drain (S/D) region 108 formed over a substrate (not shown), a first channel region 109 formed over the first S/D region 108, a first gate structure 110 formed around the first channel region 109, and a second S/D region 112 formed over the first channel region 109. The PMOS universal device 104 can include a third S/D region 114 formed over the isolation structure 106, a second channel region 115 formed over the third S/D region 114, a second gate structure 116 formed around the second channel region 115, and a fourth S/D region 118 formed over the second channel region 115.

In some embodiments, the first S/D region 108 and the third S/D region 114 can be made of a same n-type epitaxial material, the first channel region 109 and the second channel region 115 can be made of a same intrinsic epitaxial material, the second S/D region 112 and the fourth S/D region 118 can be formed based on a same p-type epitaxial material. However, the first gate structure 110 and the second gate structure 116 can be formed based on different materials that have different work functions.

According to the biasing scheme 100, in the NMOS universal device 102, a positive S/D voltage (e.g., $V_D$) can be applied on the first S/D region 108, a positive gate voltage (e.g., $V_G$) can be applied on the first gate structure 110, and the second S/D region 112 can be grounded (e.g., Vs is equal to zero). Accordingly, the first S/D region 108 can function as a drain terminal, the second S/D region 112 can function as a source terminal, and a positive channel current (e.g., $I_0$) can be formed that flows towards the substrate (not shown). In the PMOS universal device 104, a negative S/D voltage (e.g., $V_D$) can be applied on the fourth S/D region 118, a negative gate voltage ($V_G$) can be applied on the second gate structure 116, and the third S/D region 114 can be grounded (e.g., Vs is equal to zero). Accordingly, the fourth S/D region 118 can function as a drain terminal, the third S/D region 114 can function as a source terminal, and a negative channel current can be formed that flows away from the substrate (not shown). Thus, as shown in FIG. 1, the NMOS universal device 102 and the PMOS universal device 104 can have similar structures, but can function as a NMOS device and a PMOS device respectively according to the applied bias voltages in the bias scheme 100.

Figure 2:
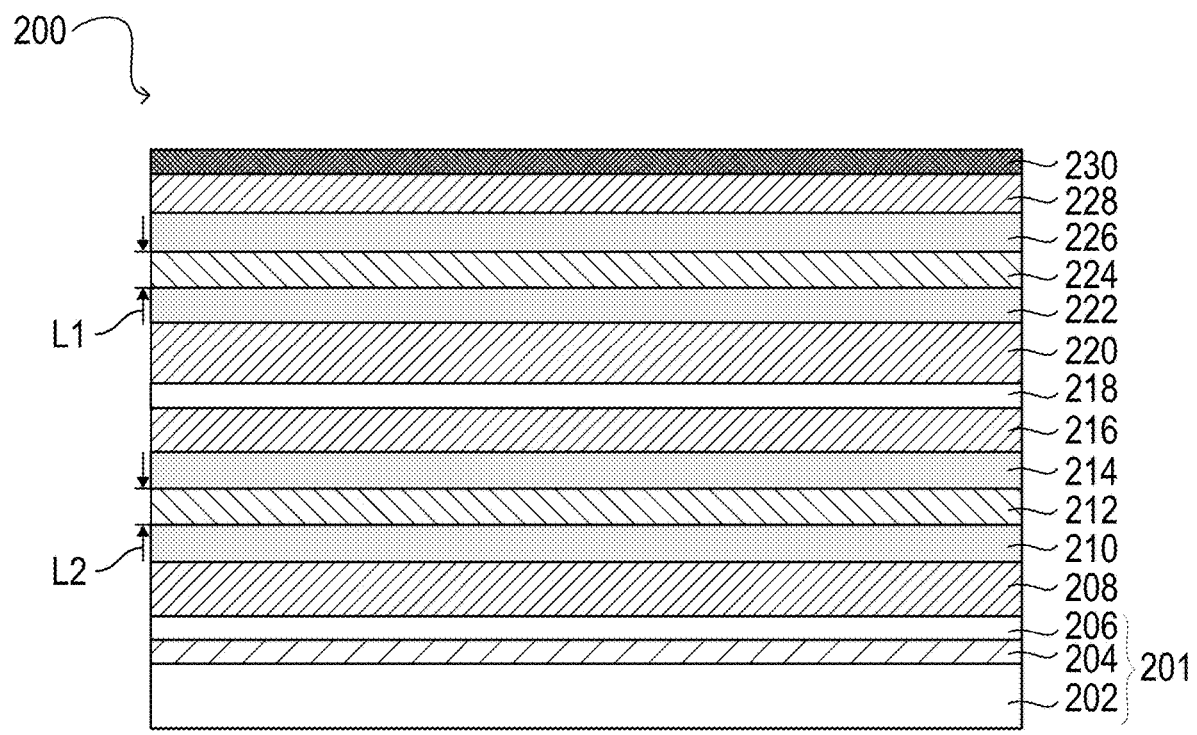
FIGS. 2-12 are cross-sectional views of various intermediate steps in a first manufacturing flow to fabricate universal devices, in accordance with some embodiments.

FIGS. 2-12 are cross-sectional views of various intermediate steps in a first manufacturing flow (e.g., flow A) to fabricate universal devices, in accordance with some embodiments. In FIG. 2, a stack of dielectric layers 200 can be deposited on a substrate 201. In an example, the substrate 201 can be a silicon on insulator (SOI) substrate that can include a first semiconductor layer 202, an insulating layer 204, and a second semiconductor layer 206. The first semiconductor layer 202 and the second semiconductor layer 206 can include silicon (Si), germanium (Ge), silicon carbide (SiC), silicon germanium (SiGe), or diamond. Alternately, the first semiconductor layer 202 and the second semiconductor layer 206 may include a compound semiconductor and/or an alloy semiconductor, such as silicon phosphide (SiP), silicon phosphorus carbide (SiPC), a silicon-on-insulator (SOI) structure, a III-VI materials, the like, or a combination thereof. The insulating layer 204 can be made of a dielectric material, such as such as silicon oxide ($SiO_2$), silicon nitride ($Si_3N_4$), silicon oxynitride (SiON), a high-K dielectric material, silicon carbide, the like, or a combination thereof.

The stack of dielectric layers 200 (or stack 200) can include a plurality of dielectric layers that are made of various dielectric materials. In an exemplary embodiment of FIG. 2, the stack of dielectric layers 200 can include dielectric layers 208-228. The stack 200 can be formed based on at least three different dielectric materials with respective etch selectivity. For example, the dielectric layers 208, 216, 220, and 228 can be made of a first dielectric material. The dielectric layers 212, and 224 can be made of a second dielectric material. The dielectric layers 210, 214, 222, and 226 can be made of a third dielectric material. The dielectric layer 218 can be formed based on a fourth dielectric material and function as an intermediate layer. In the stack 200, a hardmask layer 230 can further be formed on the dielectric layer 228 that can be used as a mask layer in subsequent manufacturing steps. The hardmask layer 230 can be silicon nitride, silicon carbon nitride, silicon oxynitride, silicon carbon oxynitride, titanium nitride, the like, or a combination thereof.

In some embodiments, the dielectric layers are selective to one another in that one layer can be etched/removed without etching or removing remaining layers. That is, there are one or more etchants and/or etching conditions such that a given one of the dielectric layers can be etched by an etching process without etching (or substantially etching) the other dielectric layers. An example dielectric scheme applied in stack 200 can include oxide based SiOx, SiOxNy based, SiCxNy based, high-k based, low-k based (e.g., SiCOH), and high-k OxNy based. For high-k based dielectric layers, elements can be adjusted to form different types of high-k dielectric layers with different selectivity. The etching process can be either a wet etch or a dry etch. To further enhance selectivity options and combinations of all wet, all dry, or wet and dry also provides more options for a selectivity scheme of three or more materials.

It should be noted that two universal devices can be separated by an isolation structure that can be formed based on the dielectric layer (or intermediate layer) 218. In addition, channel lengths of the two universal devices can be defined based on a first height L1 of the dielectric layer 224 and a second height L2 of the dielectric layer 212. The first height L1 and the second height L2 can be the same or different lengths as options.

In various embodiments, each of the dielectric layers 208-228 and the hardmask layer 230 can be deposited by a suitable deposition process, such as chemical vapor deposition (CVD), physical vapor deposition (PVD), atomic layer deposition (ALD), thermal oxidation, e-beam evaporation, sputtering, diffusion, or any combination thereof.

Figure 3:
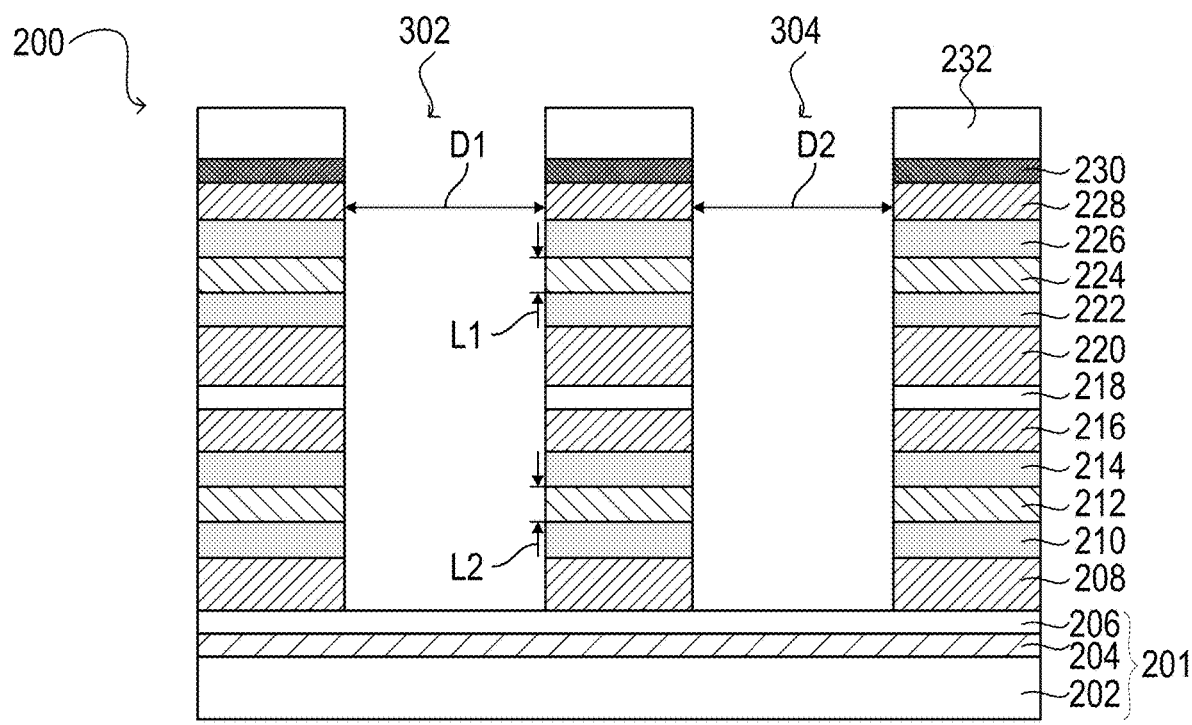

In FIG. 3, a patterning process can be applied to form a photoresist layer 232 with patterns on the hardmask layer 230. In some embodiments, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combination thereof. The photoresist layer 232 and the hardmask layer 230 can be combined to function as an etch mask during an etching process that is applied on the stack 200 subsequent to the formation of the patterned photoresist layer 232.

The etching process can be a dry etch, a wet etch, or a combination thereof. The etching process can form openings in the stack of dielectric layers 200 based on the patterns of the photoresist layer 232 such that the second semiconductor layer 206 of the substrate 201 can be uncovered. In an exemplary embodiment of FIG. 3, two openings 302 and 304 are provided. The first opening 302 can have a critical dimension (CD) D1 and the second opening 304 can have a CD D2. The D1 and D2 can be equal or different.

Figure 4:
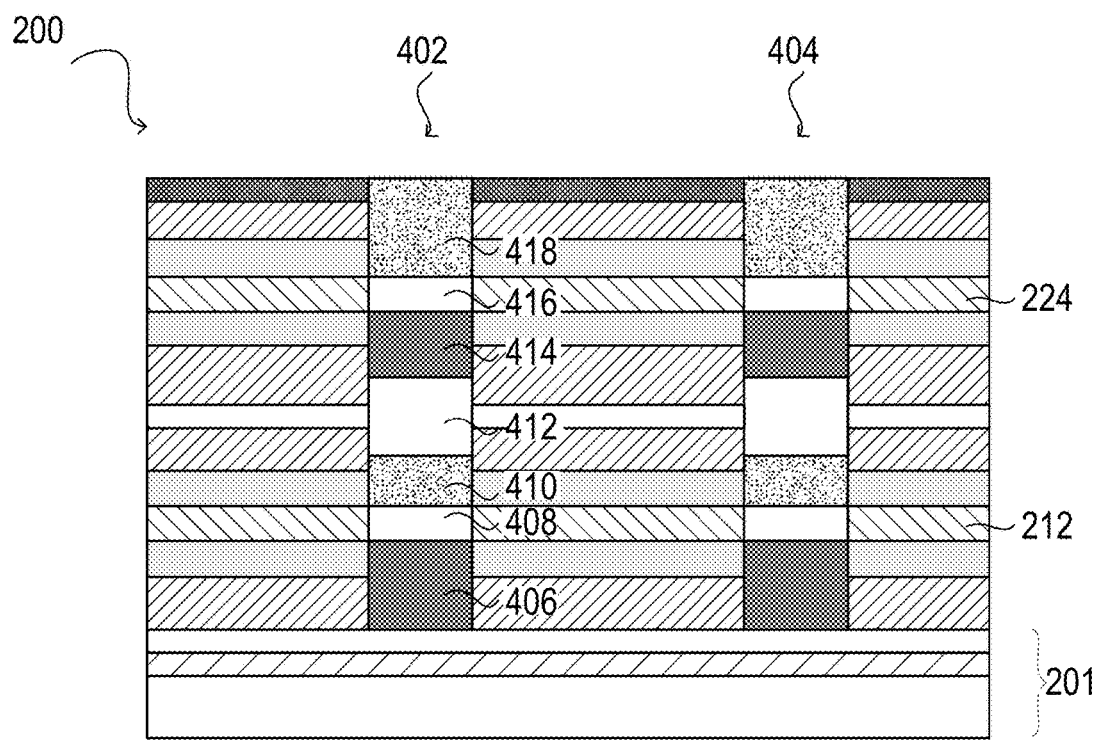

In FIG. 4, the photoresist layer 232 can be removed followed by epi (or epitaxial) stack formation (layer growth by epitaxy) for two universal devices (or universal 3D devices) with future isolation between the two universal 3D devices. As shown in FIG. 4, two epi stacks 402 and 404 can be formed by epitaxial growth. Each of the epi stacks can include a stack formed of N+ epi/intrinsic epi/P+ epi/intrinsic epi/N+ epi/intrinsic epi/P+ epi. In another example, each of the epi stacks can include a stack formed of P+ epi/intrinsic epi/N+ epi/intrinsic epi/P+ epi intrinsic epi/N+ epi. For simplicity and clarity, subsequent manufacturing steps are provided based on the epi stack 402.

As shown in FIG. 4, the epi stack 402 can include a first N+ epitaxial layer 406 formed over the substrate 201, a first intrinsic epitaxial layer 408 formed over the first N+ epitaxial layer 406 and surrounded by the dielectric layer 212, a first P+ epitaxial layer 410 formed over the first intrinsic epitaxial layer 408, a middle layer 412 that can also be an intrinsic epitaxial layer and formed over the first P+ epitaxial layer 410, a second N+ epitaxial layer 414 formed over the middle layer 412, a second intrinsic epitaxial layer 416 formed over the second N+ epitaxial layer 414, and a second P+ epitaxial layer 418 formed over the second intrinsic epitaxial layer 416.

In some embodiments, the N+ epitaxial layers (e.g., 406 and 414) can be formed by an in-situ deposition/doping process in which n-type dopants, such as phosphorous, can be introduced during the deposition of the epitaxial layer. The N+ epitaxial layers can also be formed by a combination of an epitaxial growth process and an ion implantation process, where the epitaxial layer can be formed by the epitaxial growth process at first, and doped by the ion implantation process. Similarly, the P+ epitaxial layer (e.g., 410 and 418) can be formed by an in-situ deposition/doping process in which p-type dopants, such as boron, can be introduced during the deposition of the epitaxial layer, or by a combination of an epitaxial growth process and an ion implantation process.

In some embodiments, the first N+ epitaxial layer 406, and the first P+ epitaxial layer 410 can function as a first S/D region and a second S/D region respectively, and the first intrinsic epitaxial layer 408 can function as a first channel region for a first universal device formed over the substrate 201. The second N+ epitaxial layer 414, and the second P+ epitaxial layer 418 can function as a third S/D region and a fourth S/D region respectively, and the second intrinsic epitaxial layer 416 can function as a second channel region for a second universal device stacked over the first universal device.

Figure 5:
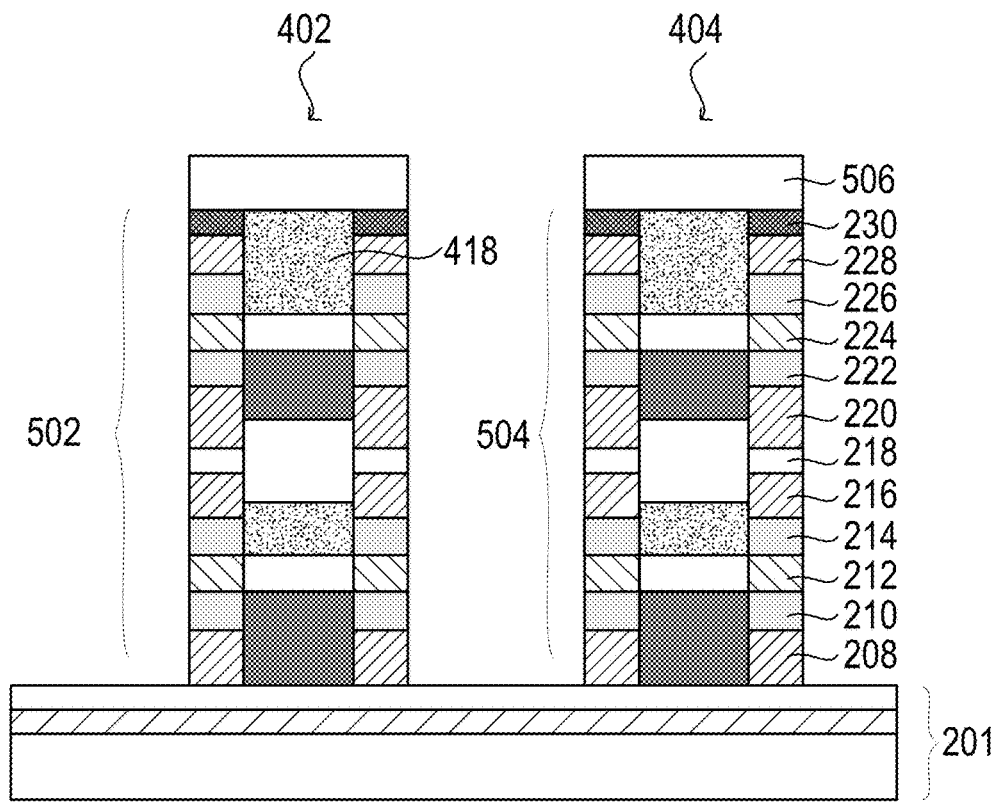

In FIG. 5, an etch mask (e.g., a photoresist layer) 506 can be formed on the hardmask layer 230 and the second P+ epitaxial layer 418. An etching process can subsequently be applied to etch the stack of dielectric layers to form a sidewall structure disposed along sidewalls of the epi stacks. The sidewall structure can be formed of the dielectric layers 208-230. For example, the epi stack 402 can be surrounded by a sidewall structure 502, and the epi stack 404 can be surrounded by a sidewall structure 504, where the sidewall structure 502 and 504 are formed of the dielectric layers 208-228. The etching process can allow access for future isolation structures, gate electrodes, and source/drain regions of the universal devices.

Figure 6:
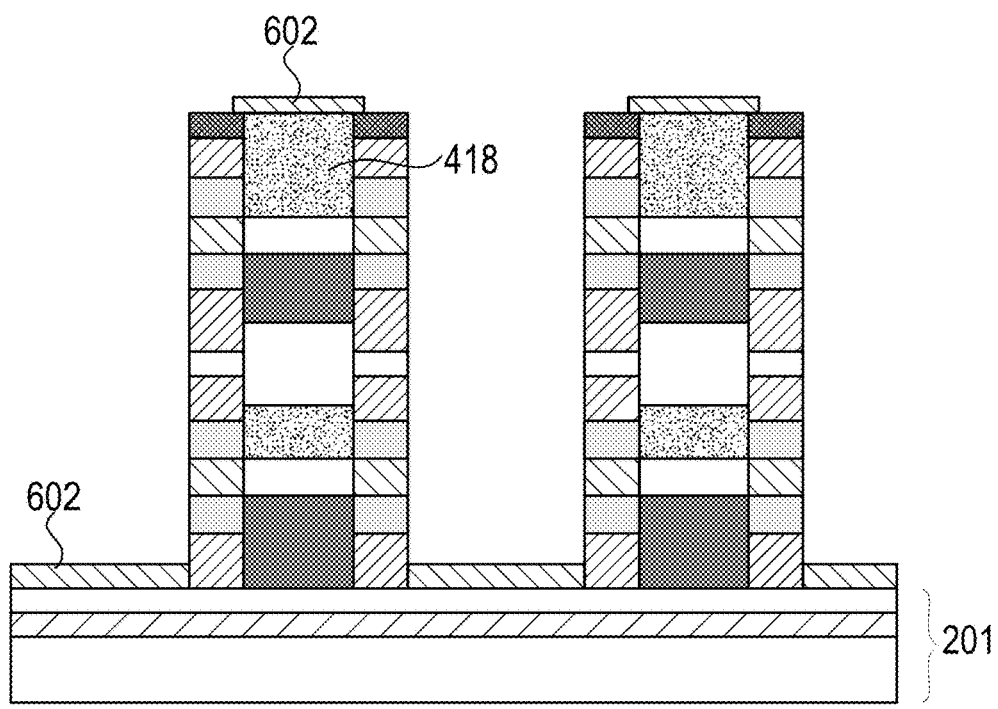

In FIG. 6, the etch mask 506 can be removed, followed optionally by a selective dielectric deposition or growth. As shown in FIG. 6, a dielectric layer 602 can be formed selectively over the second P+ epitaxial layer (e.g., 418). The dielectric layer 602 can further be deposited on the substrate 201.

Figure 7:
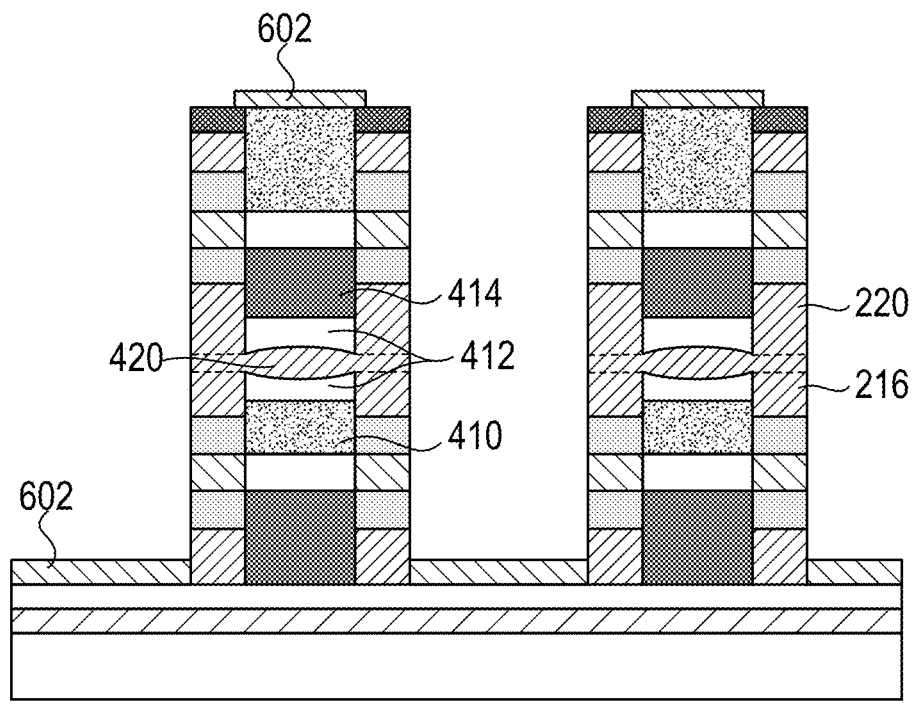

In FIG. 7, alternatively, the etch mask 506 can be removed and a 3D isolation structure (or isolation structure) 420 can be formed to extend through the middle layer 412. As shown in FIG. 7, the dielectric layer (or intermediate layer) 218 can be replaced with a dielectric material that is as same as the dielectric material applied to form the dielectric layers 216 and 220. The dielectric material can further extend through the middle layer 412 to form the isolation structure 420 that can be disposed within the middle layer 412. Accordingly, the first P+ epitaxial layer 410 and the second N+ epitaxial layer 414 can be spaced apart from each other by the isolation structure 420. The isolation structure 420 can be formed by any suitable techniques, such as techniques described in U.S. patent application Ser. No. 17/094,947 that was filed on Nov. 11, 2020.

Figure 8:
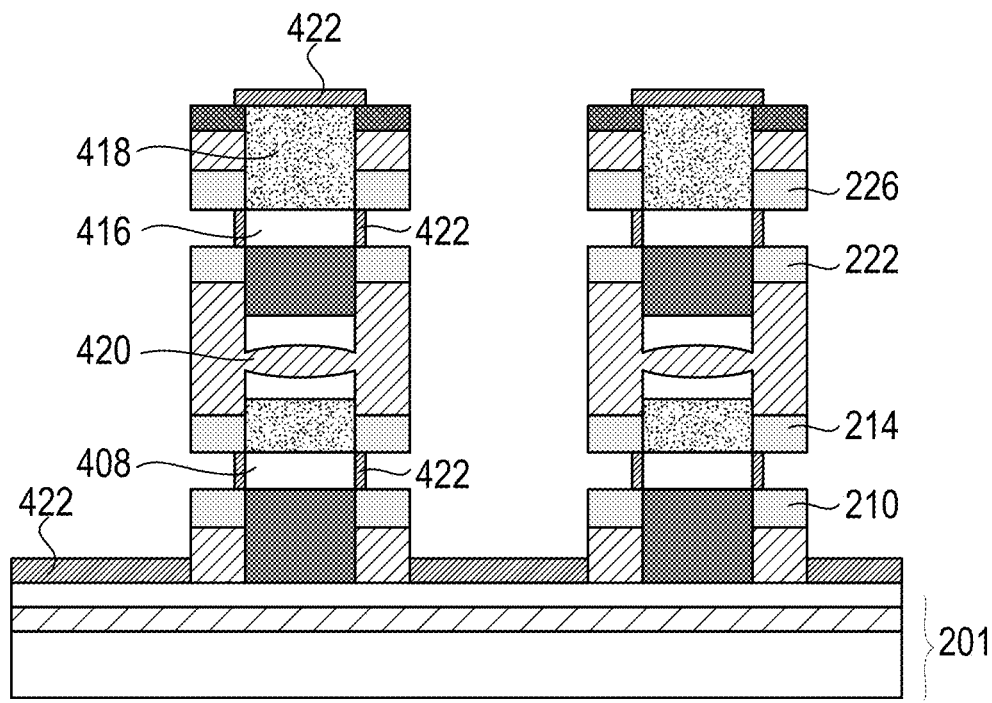

In FIG. 8, the dielectric layers 212 and 224 can be removed by an etching process and a high-k layer can be selectively deposited subsequently. As shown in FIG. 8, the high-k layer 422 can be formed selectively over the second P+ epitaxial layer 418. The high-k layer 422 can also selectively deposited around the first intrinsic epitaxial layer 408 and the second intrinsic epitaxial layer 416. The high-k layer 422 can further be disposed on the substrate 201. In some embodiment, the high-k layer can include $HfO_2$, $ZrO_2$, $HfSiNO_2$, $ZrSiNO_2$, $Y_2O_3$, $Y_3O_4$, $Si_3N_4$, TiO2, HfZrO, $Ta_2O_3$, $HfSiO_4$, $ZrSiO_2$, LaO, AlO, ZrO, TiO, $Ta_2O_5$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, Oxynitrides (SiON), combinations thereof, or other suitable material.

In some embodiments, the high-k layer 422 can include one or more dielectric layers. For example, the high-k layer 422 can include an initial dielectric layer selectively deposited around the first intrinsic epitaxial layer 408 and the second intrinsic epitaxial layer 416, a middle dielectric layer formed around the initial dielectric layer, and a final dielectric layer formed around the middle dielectric layer. The initial dielectric layer can be $SiO_2$, $Al_2O_3$, $Al_2O_3O_xN_y$, $SiO_xN_y$, or the like. The middle layer can be $HfO_2$, $ZrO_2$, $HfSiNO_2$, $ZrSiNO_2$, $Y_2O_3$, $Y_3O_4$, $Si_3N_4$, or the like. The final dielectric layer can be $SiO_2$, $Al_2O_3$, or the like. The high-k layer 422 can be formed by ALD, PVD, CVD, oxidation, diffusion, and/or other suitable deposition methods.

Figure 9:
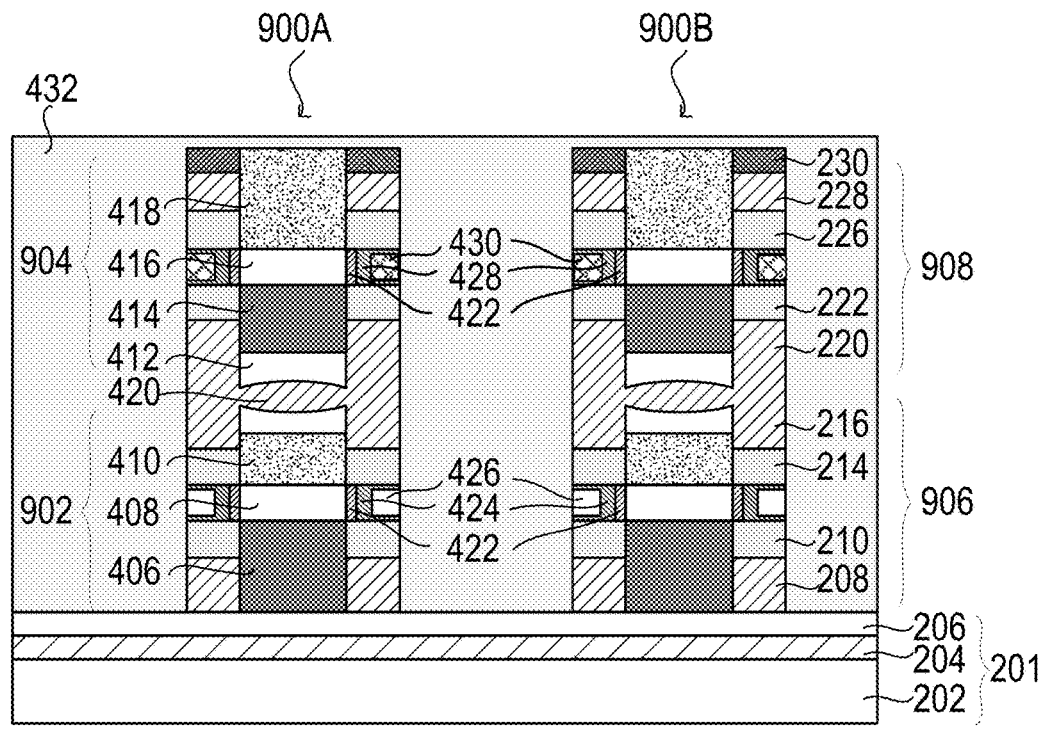

FIG. 9 shows the formation of gate electrode stacks around the high-k layer 422 to complete the manufacturing of the universal devices. The gate electrode stacks can include a transition stack around the high-k layer, and a metal stack around the transition stack. Note two different metal gate electrode stacks are shown in FIG. 9, which include a metal gate electrode stack for NMOS and a metal gate electrode stack for PMOS. However, exemplary embodiments can also include the metal gate electrode for NMOS only or the metal gate electrode PMOS only, or any combination. Once the gate electrode stacks are formed in the epi stacks 402 and 404, two stacks of universal devices (or stacks) 900A and 900B can be formed accordingly. For example, the stack 900A can include a lower (or first) universal device 902 and an upper (or second) universal device 904 that are stacked over the substrate 201. The stack 900B can include a lower (or first) universal device 906 and an upper (or second) universal device 908 that are stacked over the substrate 201. In some embodiments, a inter layer dielectric (ILD) 432 can be formed to fill gaps between the two stacks of universal devices 900A and 900B. The ILD 432 can include SiO, SiN, SiON, SiCN, the like, or a combination thereof.

Still referring to FIG. 9, that lower universal device 902 can include a first gate electrode (or gate structure) that include the high-k layer 422 around the first channel region (or the first intrinsic epitaxial layer) 408, a first transition stack 424 over the high-k layer 422 and around the first channel region 408, and a first metal stack 426 over the first transition stack 424 and around the first channel region 408. The first transition stack 424 can include TiN, TaN, or the like. The first metal stack 426 can include work functions layers that are compatible with NMOS, such as TiC, AlTiC, AlTiO, or other suitable work function layers. The first metal stack 426 can also include one or more liners (e.g., TiN) and a gate fill layer that can be made of tungsten, ruthenium, cobalt, or the like.

The upper universal device 904 can include a second a second gate electrode (or gate structure) around the second channel region (or the second intrinsic epitaxial layer) 416. The second gate structure can include the high-k layer 422 around the second channel region 416, a second transition stack 428 over the second high-k layer 422 and around the second channel region 416, and a second metal stack 430 over the second transition stack 428 and around the second channel region 416. The second transition stack 428 can include TiN, TaN, or the like. The second metal stack 430 can include work functions layers that are compatible with PMOS, such as TiC, TiON, AlTiN, AlTiC, AlTiO, or other work function layers. The second metal stack 430 can also include one or more liners (e.g., TiN) and a gate fill layer that can be made of tungsten, ruthenium, cobalt, or the like.

For simplicity and clarity, the manufacturing steps above are provided based on stack 900A. It should be noted that the stack 900B can have similar configurations to the stack 900A.

Still referring to FIG. 9, the lower universal device 902 can include the first S/D region (or the first N+ epitaxial layer) 406 formed over the substrate 201, the first channel region 408 over the first S/D region 406, the second S/D region (or the first P+ epitaxial layer) 410 over the first channel region 408, and a first gate structure positioned between the first S/D region 406 and the second S/D region 410 and around the first channel region 408. An isolation structure 420 can be positioned over the lower universal device 902, and further extend along a top surface of the substrate 201. The upper universal device 904 can be formed over the isolation structure 420 and spaced apart from the lower universal device 902 by the isolation structure 420. The upper universal device 904 can include the third S/D region (or the second N+ epitaxial layer) 414 positioned over the isolation structure 420, the second channel region 416 over the third S/D region 414, the fourth S/D region (or the second P+ epitaxial layer) 418 over the second channel region 416, and a second gate structure positioned between the third S/D region 414 and the fourth S/D region 418 and around the second channel region 416. The lower universal device 902 can be a NMOS device or a PMOS device according to applied bias voltages. The upper universal device 904 can be a NMOS device or a PMOS device according to applied bias voltages. In an exemplary embodiment of FIG. 9, the lower universal device 902 can be a NMOS and the upper universal device 904 can be a PMOS. Thus, FIG. 9 illustrates a PMOS stacked over a NMOS.

Figure 10:
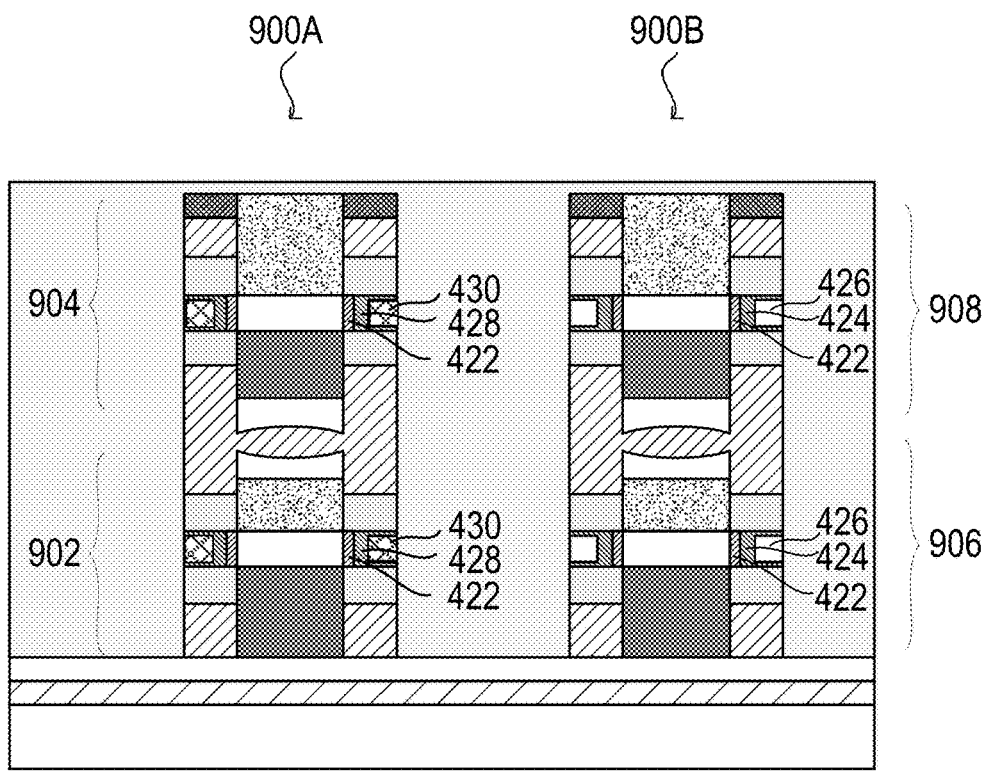

FIG. 10 shows an alternative embodiment of the two stacks of universal devices 900A and 900B. As shown in FIG. 10, the two stacks of universal devices 900A and 900B can include two different gate electrode configurations. The stack 900A is formed of a PMOS (e.g., 904) stacked over a PMOS (e.g., 902), and the stack 900B is formed of a NMOS (e.g., 908) over a NMOS (e.g., 906) according to the gate electrode configurations.

Figure 11:
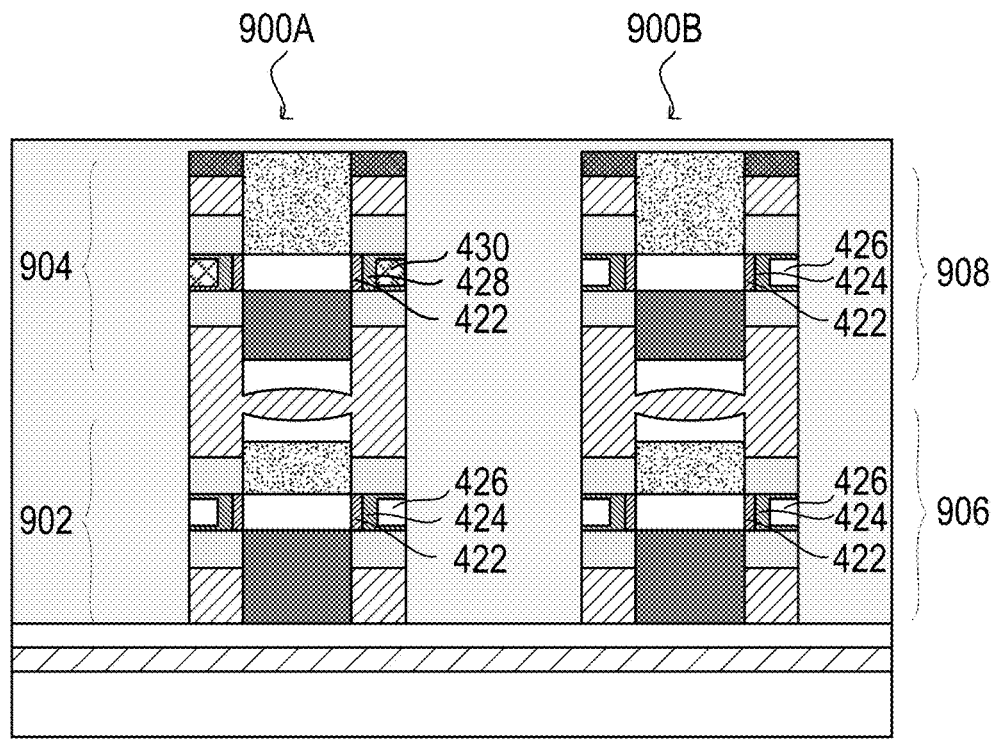

FIG. 11 shows another option with two different gate electrode configurations. The stack 900A is formed of a PMOS (e.g., 904) over a NMOS (e.g., 902), and the stack 900B is formed of a NMOS (e.g., 908) over a NMOS (e.g., 906). As can be appreciated, many other combinations are contemplated.

Figure 12:
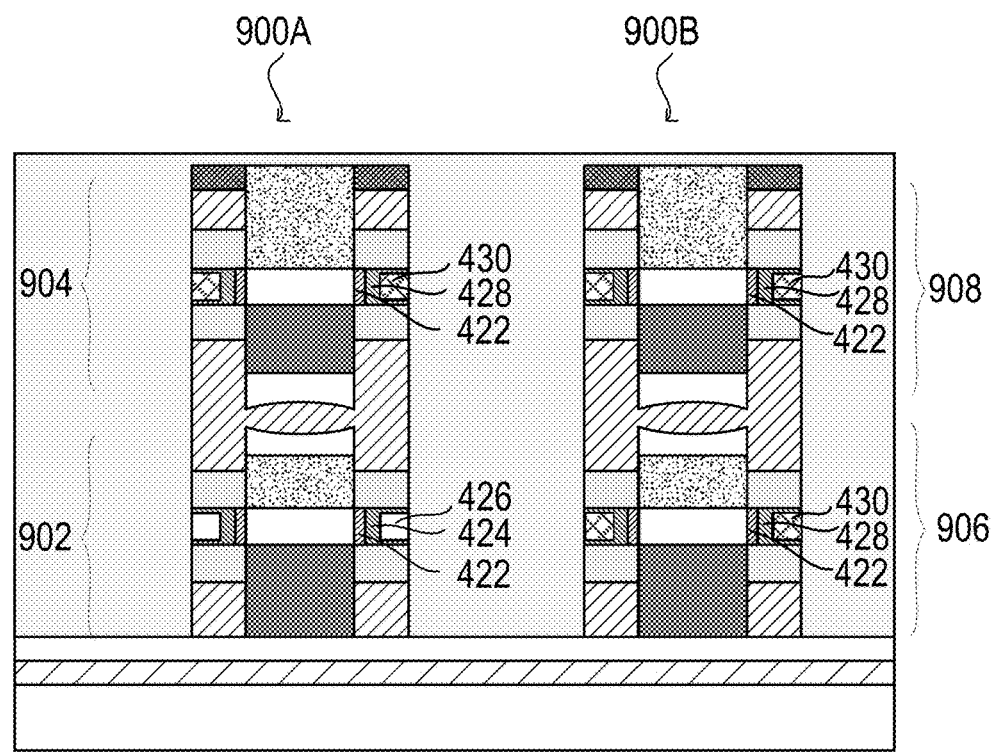

FIG. 12 shows that the stack 900A can be formed of a PMOS (e.g., 904) over a NMOS (e.g., 902), and the stack 900B can be formed of a PMOS (e.g., 908) over a PMOS (e.g., 906).

FIGS. 13-23 illustrate cross-sectional views of various intermediate steps in a second manufacturing flow (e.g., flow B) to fabricate universal devices. The flow B illustrates a manufacturing flow to fabricate a stack of devices having a universal device underlying one or more NMOS or PMOS devices, where the universal device and the one or more NMOS or PMOS devices can be separated by a 3D isolation structure. In an exemplary embodiment of flow B, the stack of device includes a universal device on a bottom of stack and a PMOS on a top of the stack. Of course, other combinations are possible. Another exemplary embodiment of flow B can include forming an inverter in that the 3D isolation structure is not introduced between the universal device and the one or more NMOS or PMOS devices.

Figure 13:
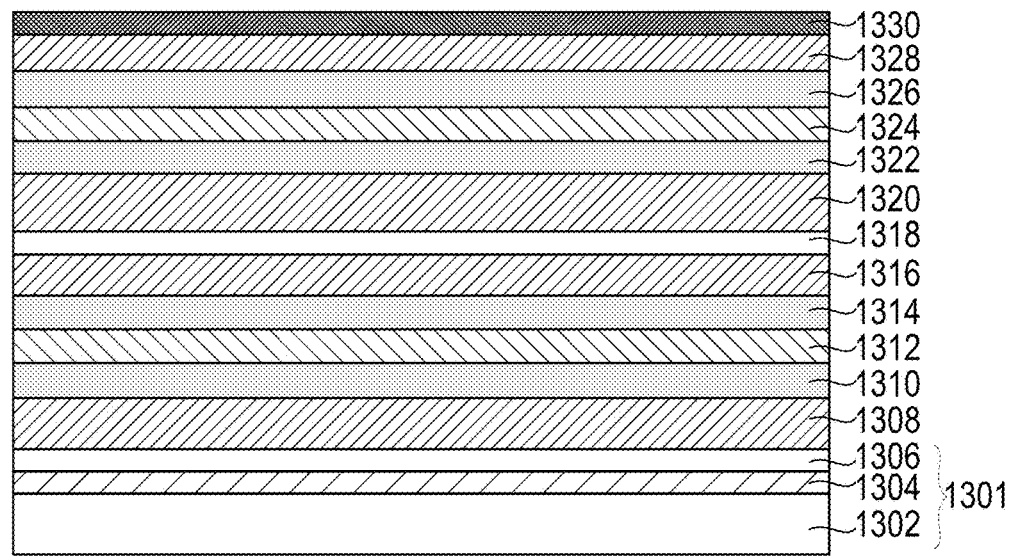
FIGS. 13-23 are cross-sectional views of various intermediate steps in a second manufacturing flow to fabricate universal devices, in accordance with some embodiments.

In FIG. 13, a stack of dielectric layers (or stack) 1300 can be formed over a substrate 1301. The stack of dielectric layers 1300 can include a plurality of dielectric layers 1308-1328 and a hardmask layer 1330. The dielectric layers 1308-1328 can be similar to the dielectric layers 208-228 in FIG. 2. The substrate 1301 can include a first semiconductor layer 1302, an insulating layer 1304, and a second semiconductor layer 1306, which is similar to the substrate 201 in FIG. 2. Further, the hardmask layer 1330 can be formed over the dielectric layer 1328. The hardmask layer 1330 can also be similar to the hardmask layer 230 in FIG. 2.

Figure 14:
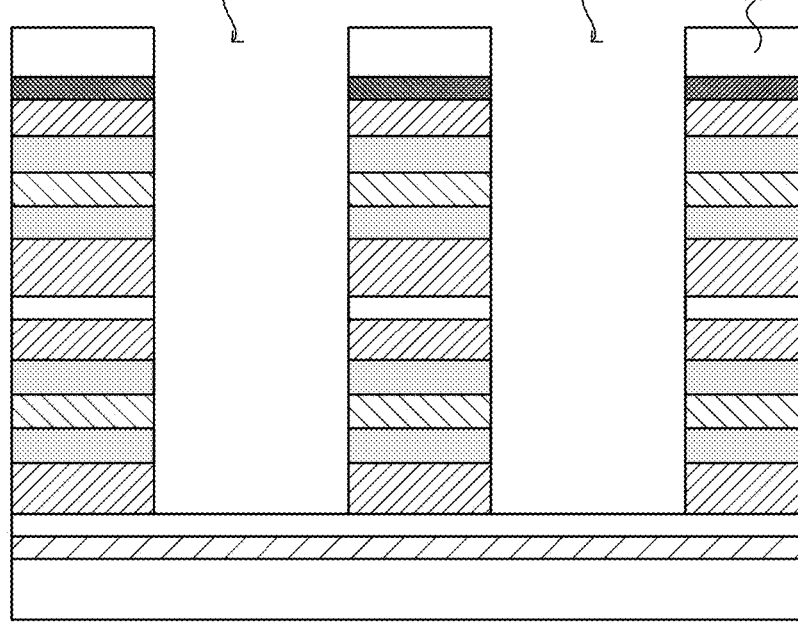

In FIG. 14, the stack 1300 can be is masked by coating a photoresist layer 1332 and etched by an etching process based on patterns of the photoresist layer 1332. The etching process can form openings (e.g., 1402 and 1403) in the stack 1300. The openings can uncover the substrate 1301.

Figure 15:
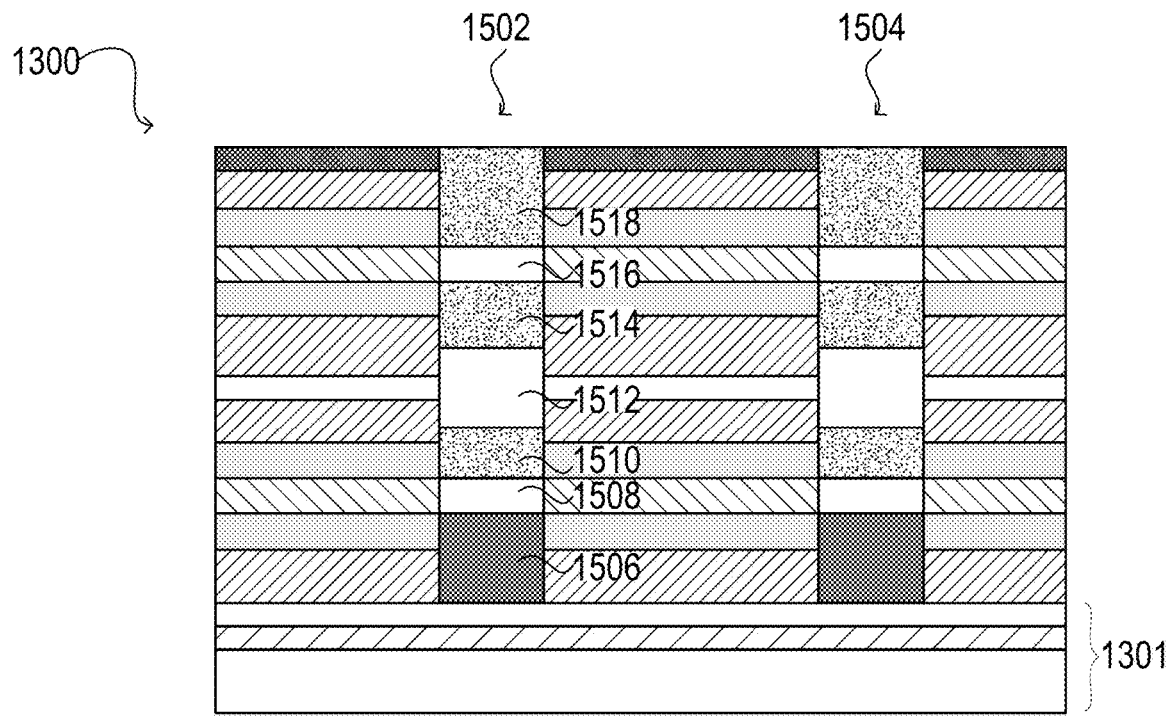

In FIG. 15, epitaxial stacks 1502 and 1504 can be grown in the defined openings 1402 and 1404 respectively. FIG. 15 shows an example to form two epitaxial stacks with a future isolation structure between the two epitaxial stacks. Each of the epi stacks can include a stack of N+ epi/intrinsic epi/P+ epi/intrinsic epi/P+ epi/intrinsic epi/P+ epi. For example, the epi stack 1502 can include a first N+ epitaxial layer 1506 formed over the substrate 1301, a first intrinsic epitaxial layer 1508 formed over the first N+ epitaxial layer 1506, a first P+ epitaxial layer 1510 formed over the first intrinsic epitaxial layer 1508, a middle layer 1512 that can also be an intrinsic epitaxial layer and formed over the first P+ epitaxial layer 1510, a second P+ epitaxial layer 1514 formed over the middle layer 1512, a second intrinsic epitaxial layer 1516 formed over the second P+ epitaxial layer 1514, and a third P+ epitaxial layer 1518 formed over the second intrinsic epitaxial layer 1516.

In some embodiments, the first N+ epitaxial layer 1506, and the first P+ epitaxial layer 1510 can function as a first S/D region and a second S/D region respectively, and the first intrinsic epitaxial layer 1508 can function as a first channel region for a universal device formed over the substrate 1301. The second P+ epitaxial layer 1514, and the third P+ epitaxial layer 1518 can function as a third S/D region and a fourth S/D region respectively, and the second intrinsic epitaxial layer 1516 can function as a second channel region for a PMOS device stacked over the universal device.

Figure 16:
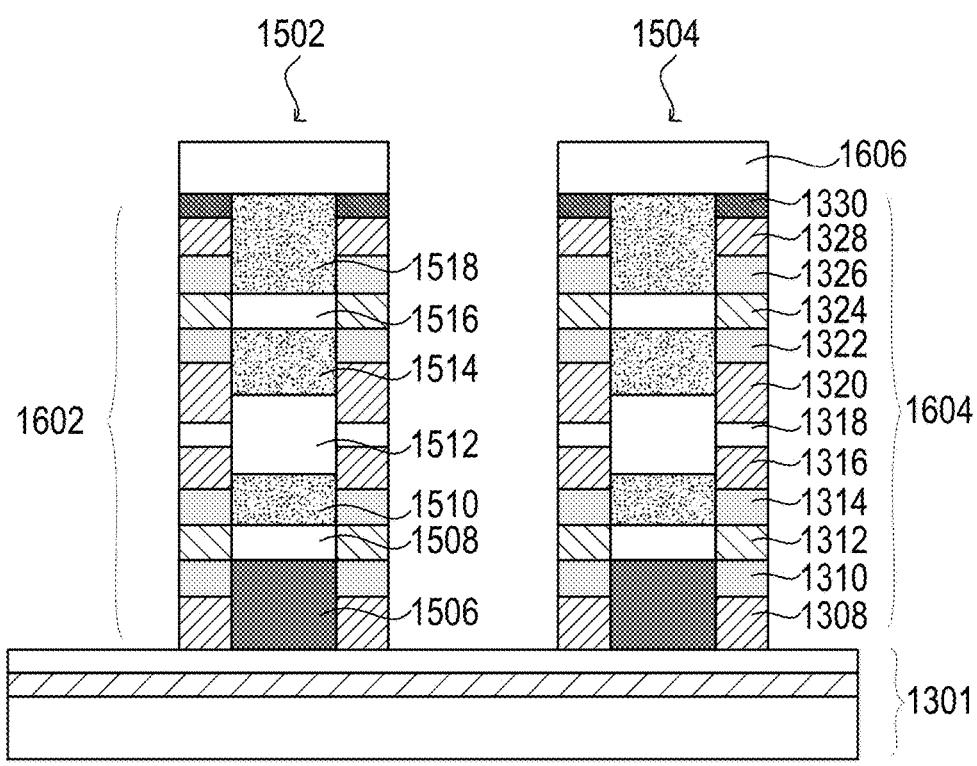

In FIG. 16, an etch step can be executed to etch the stack 1300 based on a mask layer 1606. The etch step can leave a ring of dielectric layers around the epi channels (or epi stacks) 1502 and 1504. The ring of dielectric layers can function as sidewall structures 1602 and 1604 disposed along sidewalls of the epi stacks 1502 and 1504 respectively. The sidewall structure 1602 and 1604 can be formed of the dielectric layers 1308-1330.

Figure 17:
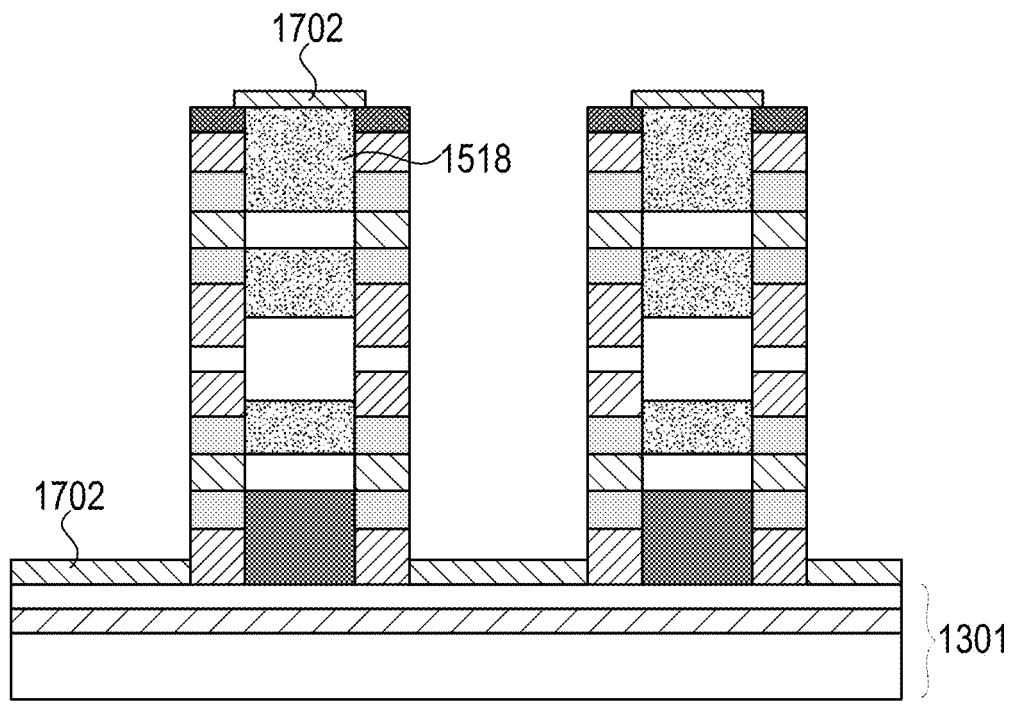

In an embodiment, as shown in FIG. 17, the mask layer 1606 can be removed and a selective dielectric deposition or growth can be operated to deposit a dielectric layer 1702 selectively over the second P+ epitaxial layer (e.g., 1518). The dielectric layer 1702 can further be deposited on the substrate 1301.

Figure 18:
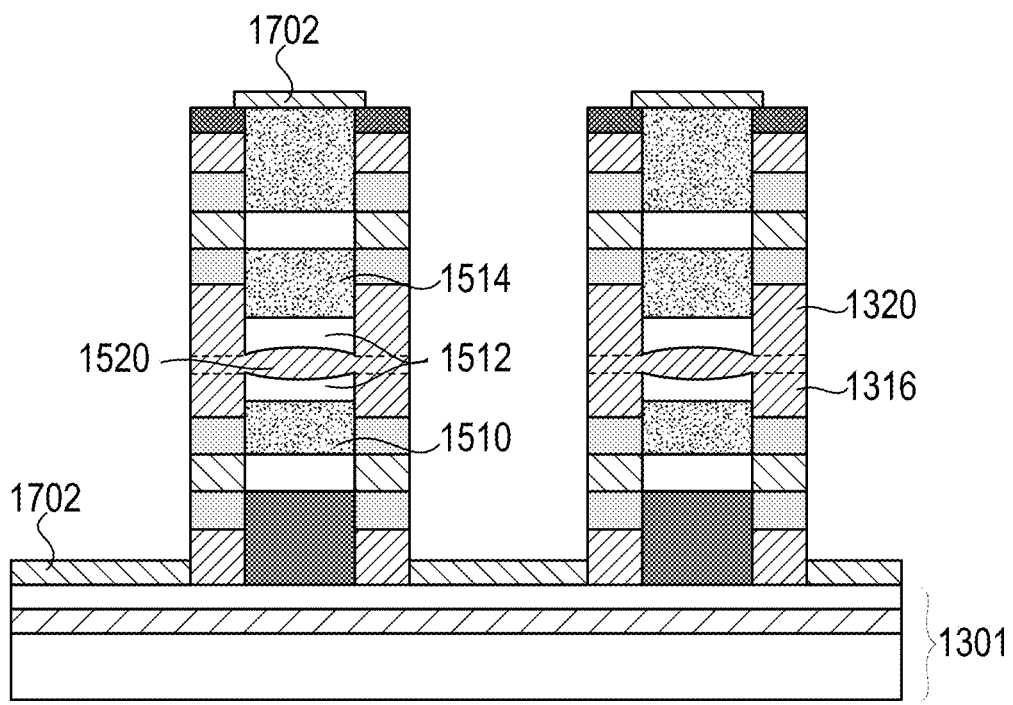

In another embodiment, as shown in FIG. 18, the mask layer 1606 cam be removed and a 3D isolation structure 1520 can be executed as described above in FIG. 7. As shown in FIG. 18, the 3D isolation structure (or isolation structure) 1520 can be formed to extend through the middle layer 1512. The 3D isolation structure 1520 can be made of a same dielectric material as the dielectric material applied to form the dielectric layers 1316 and 1320. In addition, the dielectric layer 1318 can be replaced with the dielectric material that is applied to form the 3D isolation structure 1520.

Figure 19:
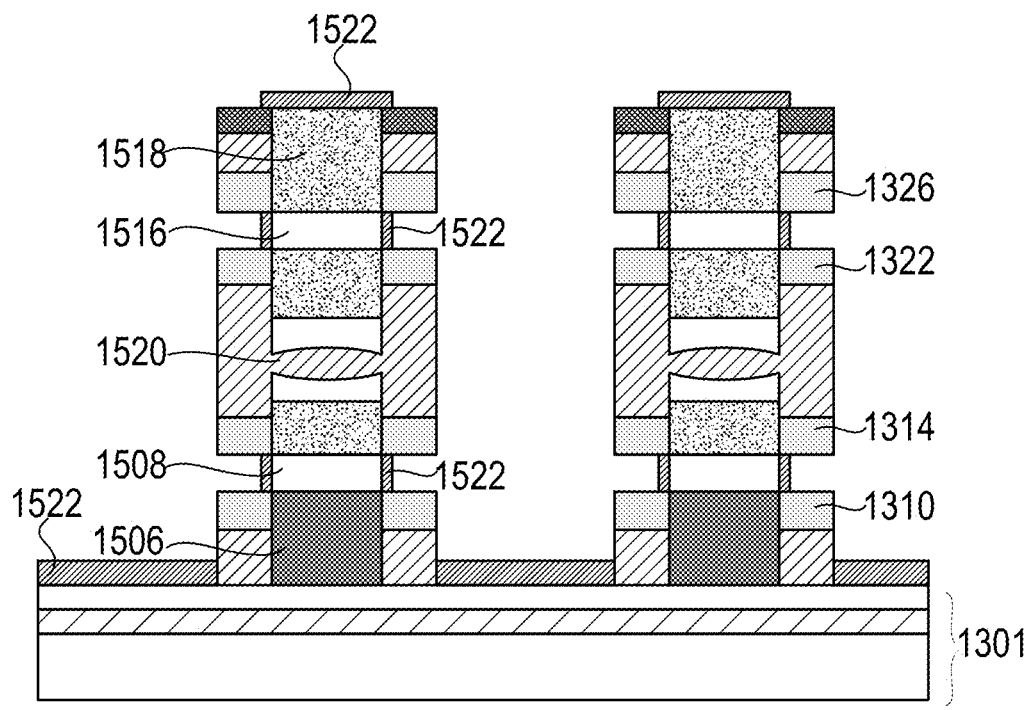

In FIG. 19, the dielectric layer 1702, the dielectric layers 1312 and 1324 can be removed and a high-k layer 1522 can be selectively deposited subsequently. As shown in FIG. 19, the high-k layer 1522 can be formed selectively over the second P+ epitaxial layer 1518. The high-k layer 1522 can also selectively deposited around the first intrinsic epitaxial layer 1508 and the second intrinsic epitaxial layer 1516. The high-k layer 1522 can further be disposed on the substrate 1301. In some embodiment, the high-k layer can include $HfO_2$, $ZrO_2$, $HfSiNO_2$, $ZrSiNO_2$, $Y_2O_3$, $Y_3O_4$, $Si_3N_4$, TiO2, HfZrO, $Ta_2O_3$, $HfSiO_4$, $ZrSiO_2$, LaO, AlO, ZrO, TiO, $Ta_2O_5$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, Oxynitrides (SiON), combinations thereof, or other suitable material.

Figure 20:
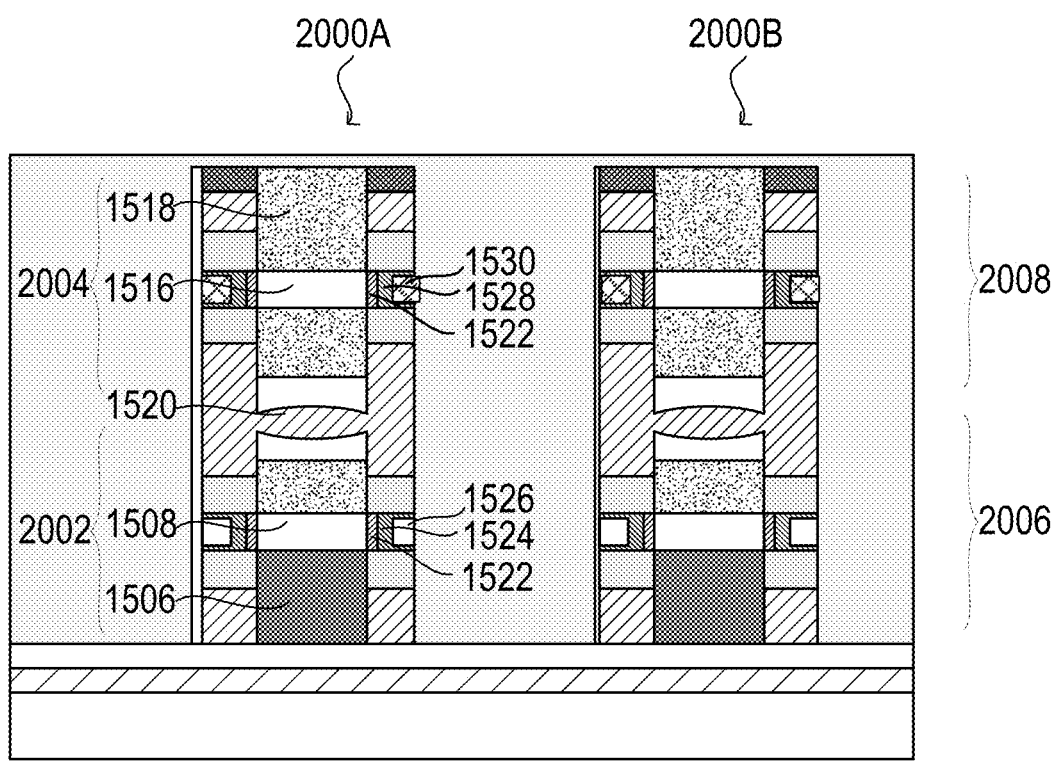

FIG. 20 shows an embodiment of complete gate electrode stacks (or gate structures) to form stacks of devices that include a PMOS over N-type universal devices. Alternatively the stacks of devices can include NMOS and P-type universal devices. Of course, the stacks of devices can include other combinations of PMOS, NMOS, P-type universal devices, and N-type universal devices. In an exemplary embodiment of FIG. 20, two stacks of devices 2000A and 2000B are provided. Each of the stacks of devices can include a respective PMOS positioned over a respective N-type universal device. For example, the stack of devices 2000A can include a PMOS 2004 over a N-type universal device 2002, and the stack of devices 2000B can include a PMOS 2008 over a N-type universal device 2006.

The N-type universal device 2002 or 2006 can include a first gate electrode (or gate structure) that include the high-k layer 1522 around the first channel region 1508, a first transition stack 1524 over the high-k layer 1522 and around the first channel region 1508, and a first metal stack 1526 over the first transition stack 1524 and around the first channel region 1508. The first transition stack 1524 can include TiN, TaN, or the like. The first metal stack 1526 can include work functions layers that are compatible with NMOS, such as TiC, AlTiC, AlTiO, or other suitable work function layers. The first metal stack 1526 can also include one or more liners (e.g., TiN) and a gate fill layer that can be made of tungsten, ruthenium, cobalt, or the like.

The PMOS 2004 or 2008 can include a second a second gate electrode (or gate structure) around the second channel region 1516. The second gate structure can include the high-k layer 1522 around the second channel region 1516, a second transition stack 1528 over the second high-k layer 1522 and around the second channel region 1516, and a second metal stack 430 over the second transition stack 1528 and around the second channel region 1516. The second transition stack 1528 can include TiN, TaN, or the like. The second metal stack 1530 can include work functions layers that are compatible with PMOS, such as TiC, TiON, AlTiN, AlTiC, AlTiO, or other work function layers. The second metal stack 1530 can also include one or more liners (e.g., TiN) and a gate fill layer that can be made of tungsten, ruthenium, cobalt, or the like.

Figure 21:
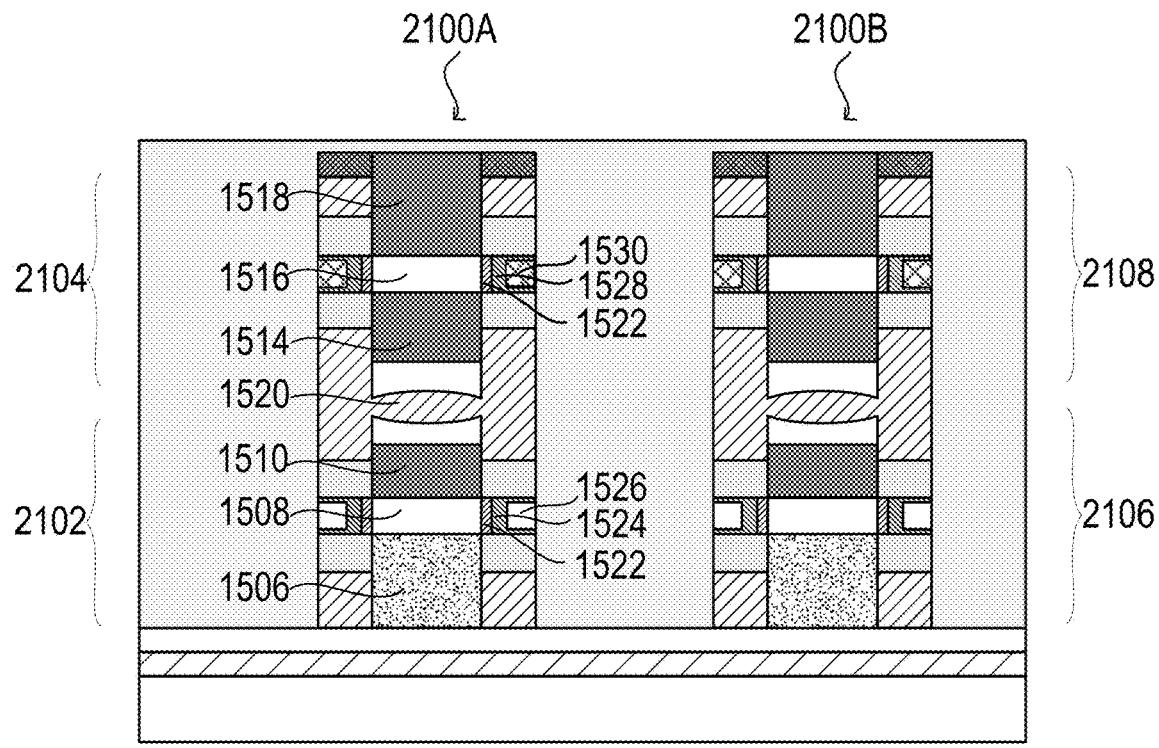

FIG. 21 shows an embodiment of complete gate electrode stacks (or gate structures) to form stacks of devices that include NMOS over P-type universal devices that are separated by isolation structures. As shown in FIG. 21, two stacks of devices 2100A and 2100B are provided. Each of the stacks of devices can include a respective NMOS positioned over a respective P-type universal device. For example, the stack of devices 2100A can include a NMOS 2104 over a P-type universal device 2102, and the stack of devices 2100B can include a NMOS 2108 over a P-type universal device 2106. The P-type universal device 2102 or 2106 can include the first gate electrode (or gate structure) that include the high-k layer 1522 around the first channel region (or the first intrinsic epitaxial layer) 1508, the first transition stack 1524 over the high-k layer 1522 and around the first channel region 1508, and the first metal stack 1526 over the first transition stack 1524 and around the first channel region 1508. The NMOS 2104 or 2108 can include the second gate electrode (or gate structure) around the second channel region (or the second intrinsic epitaxial layer) 1516. The second gate structure can include the high-k layer 1522 around the second channel region 1516, the second transition stack 1528 over the second high-k layer 1522 and around the second channel region 1516, and the second metal stack 1530 over the second transition stack 1528 and around the second channel region 1516.

It should be noted that the stack of devices 2100A or 2100B can include a first P+ epitaxial layer 1506 formed over the substrate 1301, a first intrinsic epitaxial layer 1508 formed over the first P+ epitaxial layer 1506, a first N+ epitaxial layer 1510 formed over the first intrinsic epitaxial layer 1508, a middle layer 1512 that is formed over the first N+ epitaxial layer 1510 and separated by the isolation structure 1520, a second N+ epitaxial layer 1514 formed over the middle layer 1512, a second intrinsic epitaxial layer 1516 formed over the second N+ epitaxial layer 1514, and a third N+ epitaxial layer 1518 formed over the second intrinsic epitaxial layer 1516.

Figure 22:
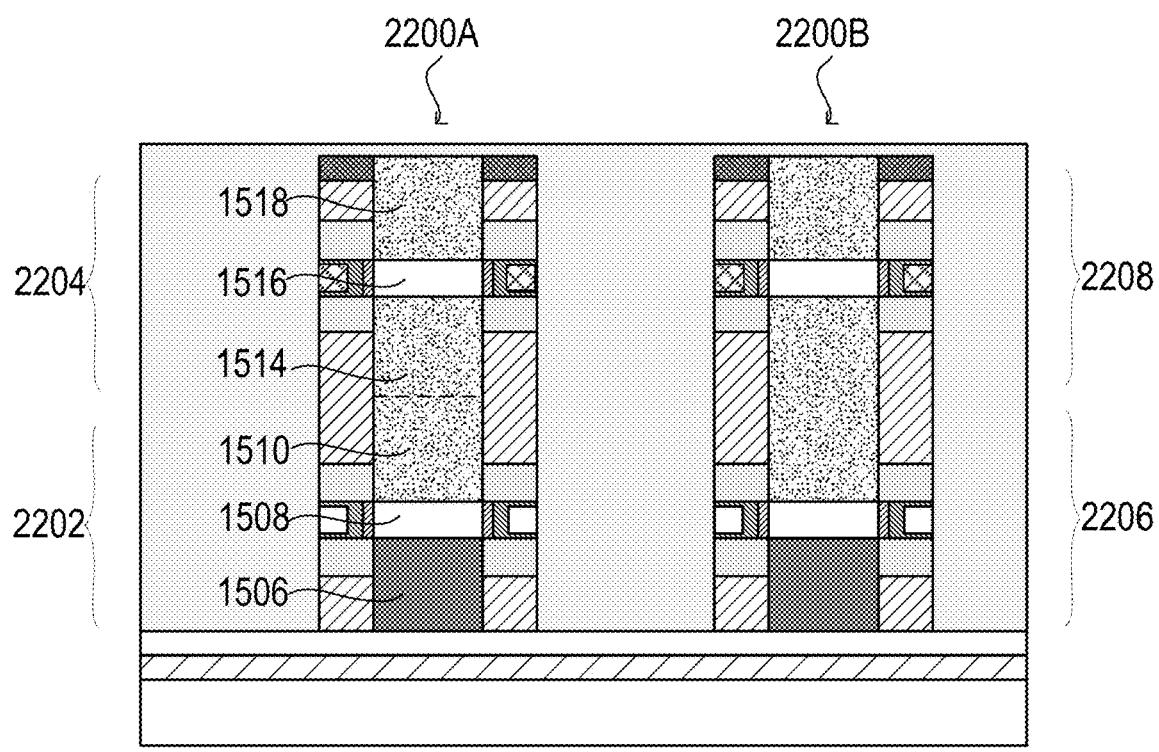

FIG. 22 shows a manufacturing process to form an inventor based on a PMOS over a N-type universal device, where the 3D isolation structure is skipped. Compared to the stacks of devices 2000A and 2000B in FIG. 20, stacks of devices 2200A and 2200B in FIG. 22 do not include the 3D isolation structures (e.g., 1520). Thus, in the stack of 2200A, the first P+ epitaxial layer 1510 and the second P+ epitaxial layer 1514 are connected to each other directly. The first P+ epitaxial layer 1510 can function as a drain terminal of the universal device 2202, and the second P+ epitaxial layer 1514 can function as a source terminal of the PMOS 2204.

Figure 23:
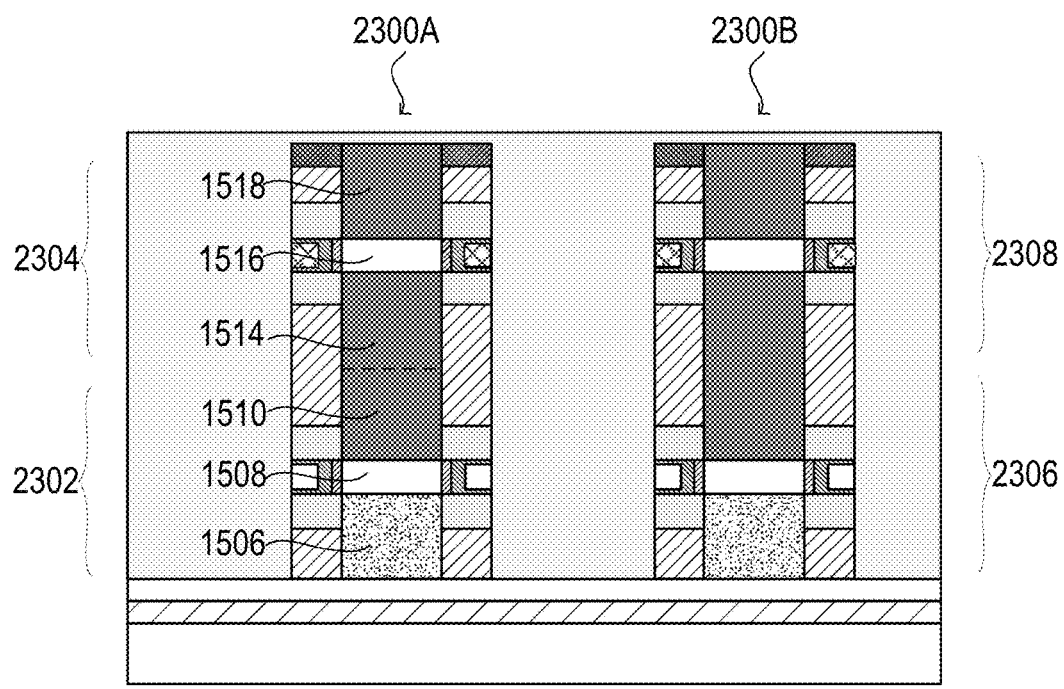
Figure 24:
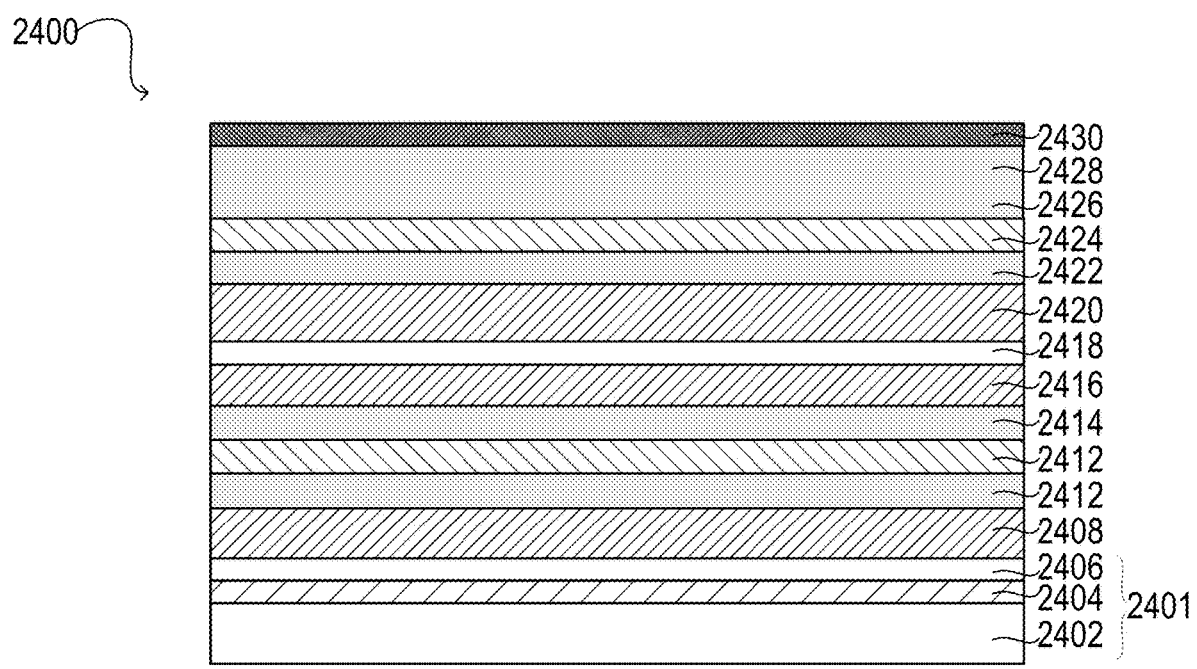
FIGS. 24-35 are cross-sectional views of various intermediate steps in a third manufacturing flow to fabricate universal devices, in accordance with some embodiments.

FIG. 23 shows a manufacturing process to form an inventor based on a NMOS over a P-type universal device, where the 3D isolation structure is skipped. Compared to the stacks of devices 2100A and 2100B in FIG. 21, stacks of devices (or stacks) 2300A and 2300B in FIG. 23 do not include the 3D isolation structures. Thus, in the stack 2300A, the first N+ epitaxial layer 1510 and the second N+ epitaxial layer 1514 are connected to each other directly.

FIGS. 24-35 illustrate cross-sectional views of various intermediate steps in a third manufacturing flow (e.g., flow C) to fabricate universal devices. The flow C illustrates a manufacturing flow to fabricate a stack of universal devices in which device types are defined based on an electrical hookup (or electrical biases).

Figure 25:
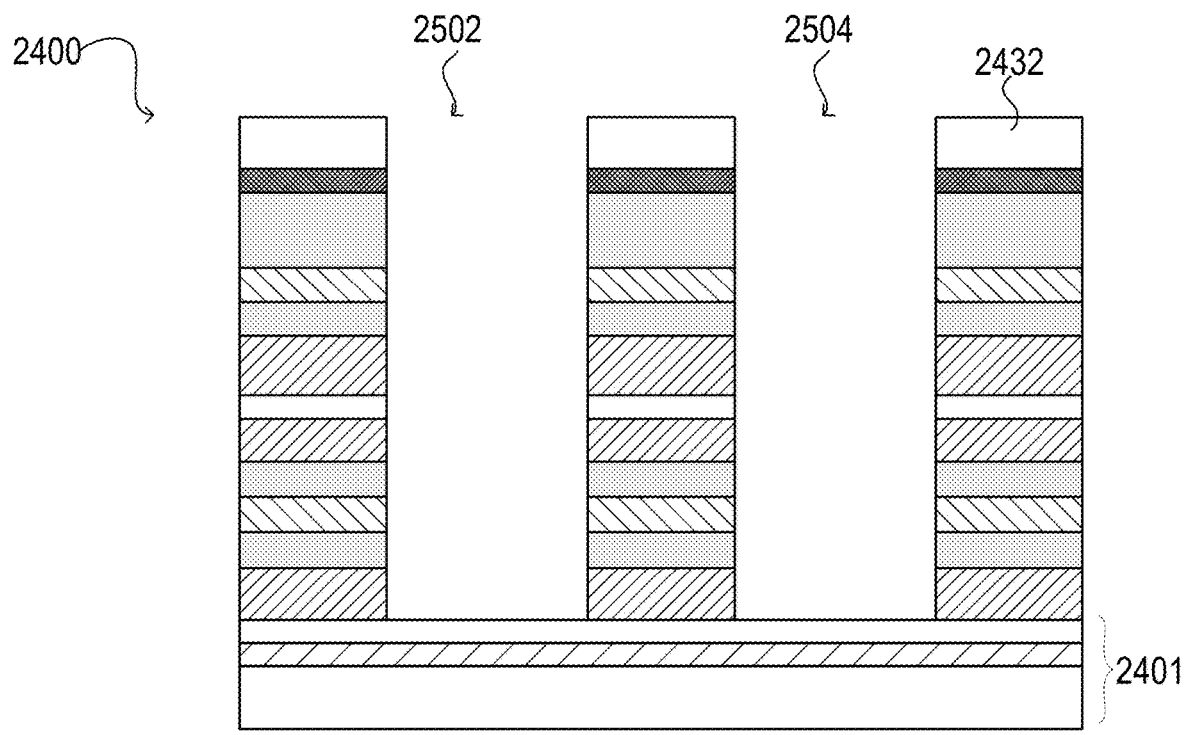
Figure 26:
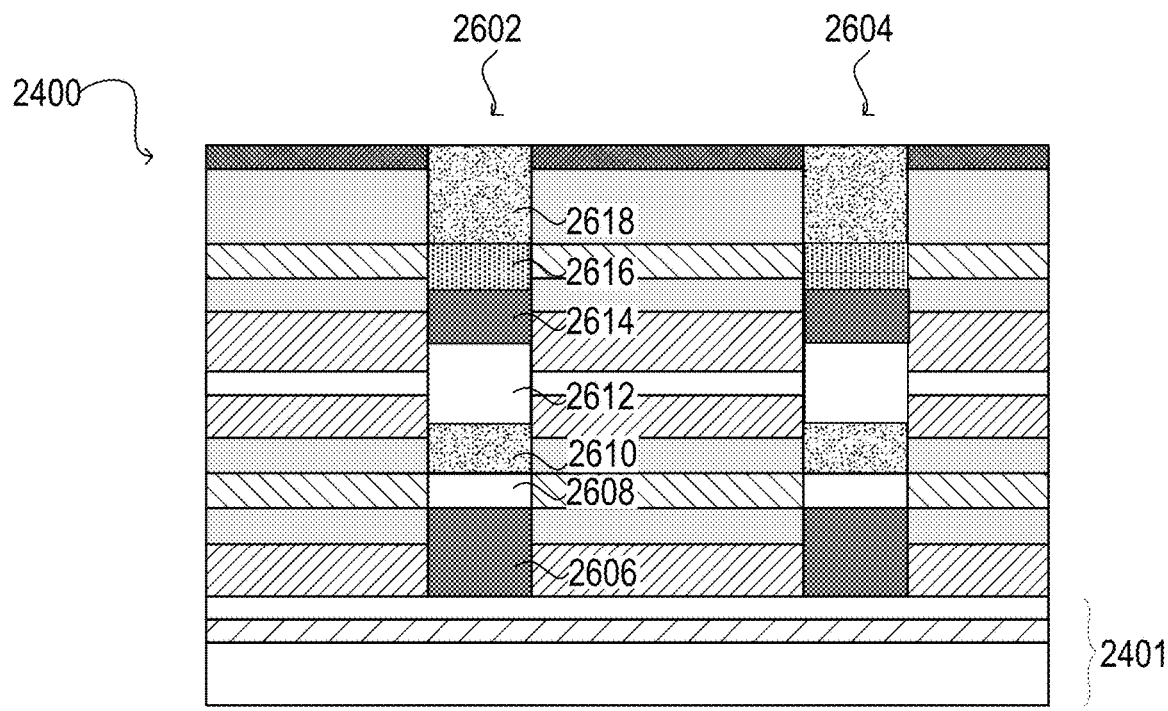

As shown in FIGS. 24-27, manufacturing steps that are similar to the manufacturing steps in FIGS. 13-16 are applied. For example, in FIG. 24, a stack of dielectric layers (or stack) 2400 can be formed over a substrate 2401. The stack of dielectric layers 2400 can include a plurality of dielectric layers 2408-2428 and a hardmask layer 2430. In FIG. 25, the stack 2400 can be is masked by coating a photoresist layer 2432 and etched by an etching process based on patterns of the photoresist layer 2432. The etching process can form openings (e.g., 2502 and 2503) in the stack 2400. The openings can uncover the substrate 2401. In FIG. 26, epitaxial stacks 2602 and 2604 can be grown in the defined openings 2502 and 2504 respectively.

The epi stack 2602 can include a first N+ epitaxial layer 2606 formed over the substrate 2401, a first intrinsic epitaxial layer 2608 formed over the first N+ epitaxial layer 2606, a first P+ epitaxial layer 2610 formed over the first intrinsic epitaxial layer 2608, a middle layer 2612 that can also be an intrinsic epitaxial layer and formed over the first P+ epitaxial layer 2610, a second N+ epitaxial layer 2614 formed over the middle layer 2612, a second intrinsic epitaxial layer 2616 formed over the second N+ epitaxial layer 2614, and a second P+ epitaxial layer 2618 formed over the second intrinsic epitaxial layer 2616. It should be noted that the first P+ epitaxial layer 2610 and the second P+ epitaxial layer 2618 can be made of SiGe. The second intrinsic epitaxial layer 2616 can be made of SiGe or Ge epitaxial layer without doping.

Figure 27:
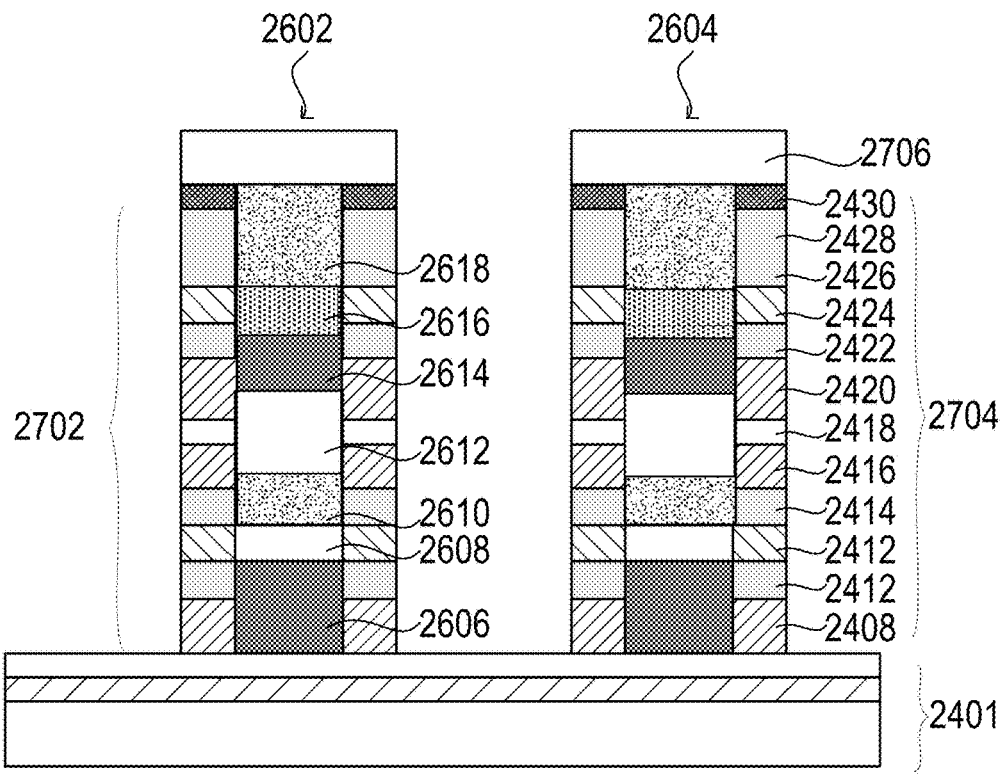

In FIG. 27, an etch step can be executed to etch the stack 2400 based on a mask layer 2706. The etch step can form sidewall structure 2702 and 2704 disposed along sidewalls of the epi stacks 2602 and 2604 respectively. The sidewall structure 2702 and 2704 can be formed of the dielectric layers 2408-2430.

Figure 28:
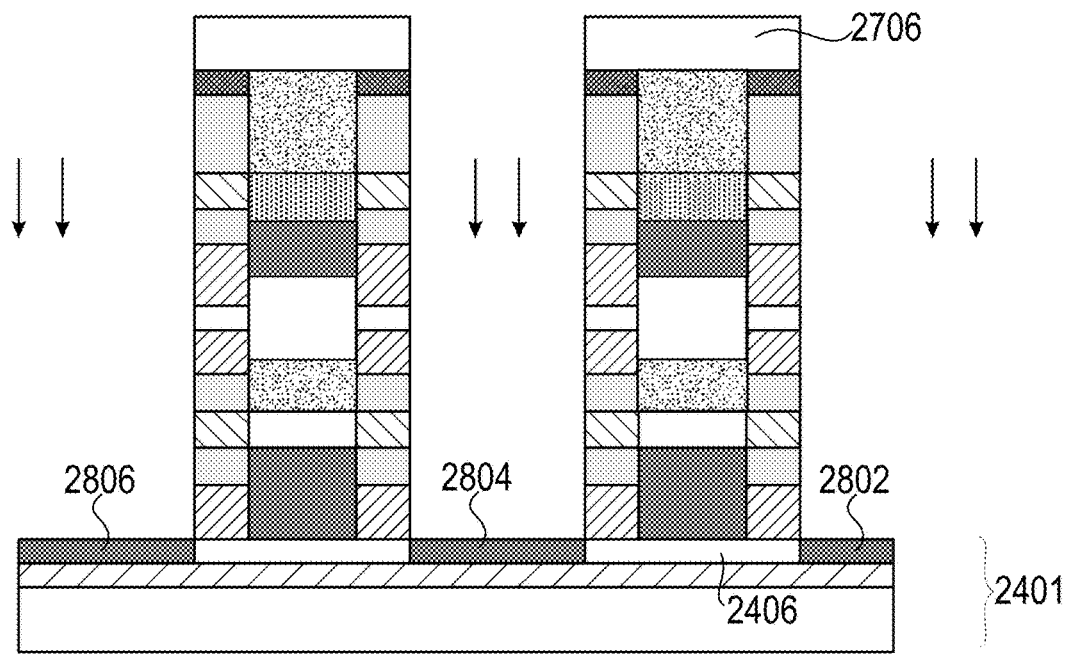

In FIG. 28, n-type dopant can be implanted in unmasked substrate regions of the substrate 2401. As shown in FIG. 28, doped regions 2802-2806 can be formed in the uncovered regions of the second semiconductor layer 2406 in the substrate 2401.

Figure 29:
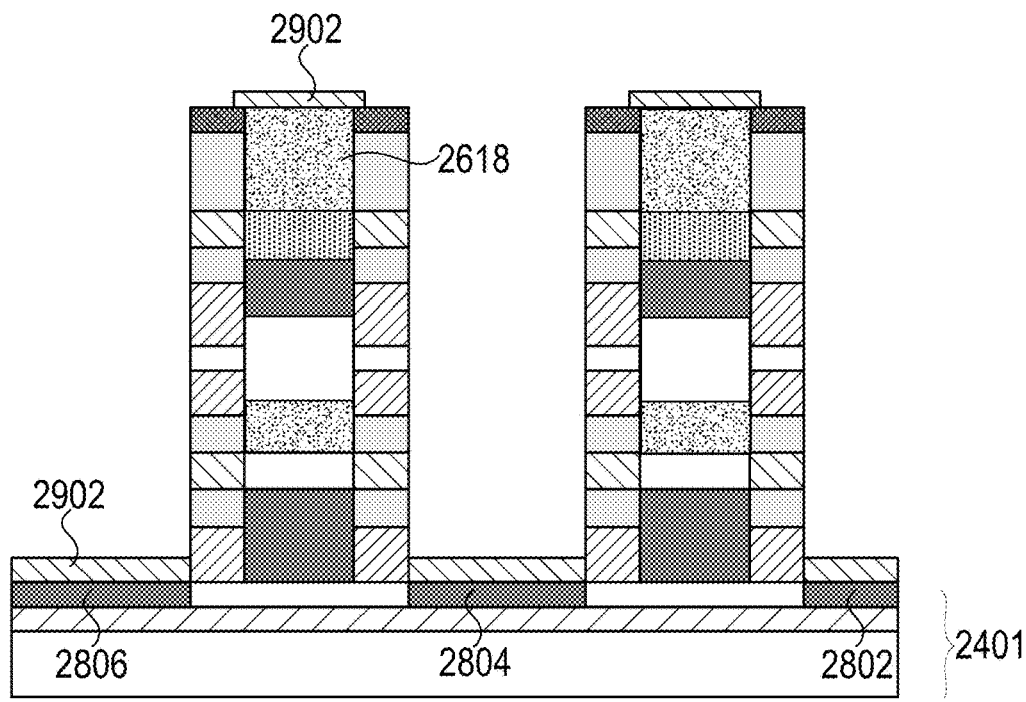

FIG. 29 shows mask removal followed by a selective deposition or a selective growth of dielectric on semiconductor material. As shown in FIG. 29, the mask layer 2706 can be removed and the selective dielectric deposition or growth can be operated to deposit a dielectric layer 2902 selectively over the second P+ epitaxial layer (e.g., 2618). The dielectric layer 2902 can further be deposited on the doped regions 2802-2806 of the substrate 2401.

Figure 30:
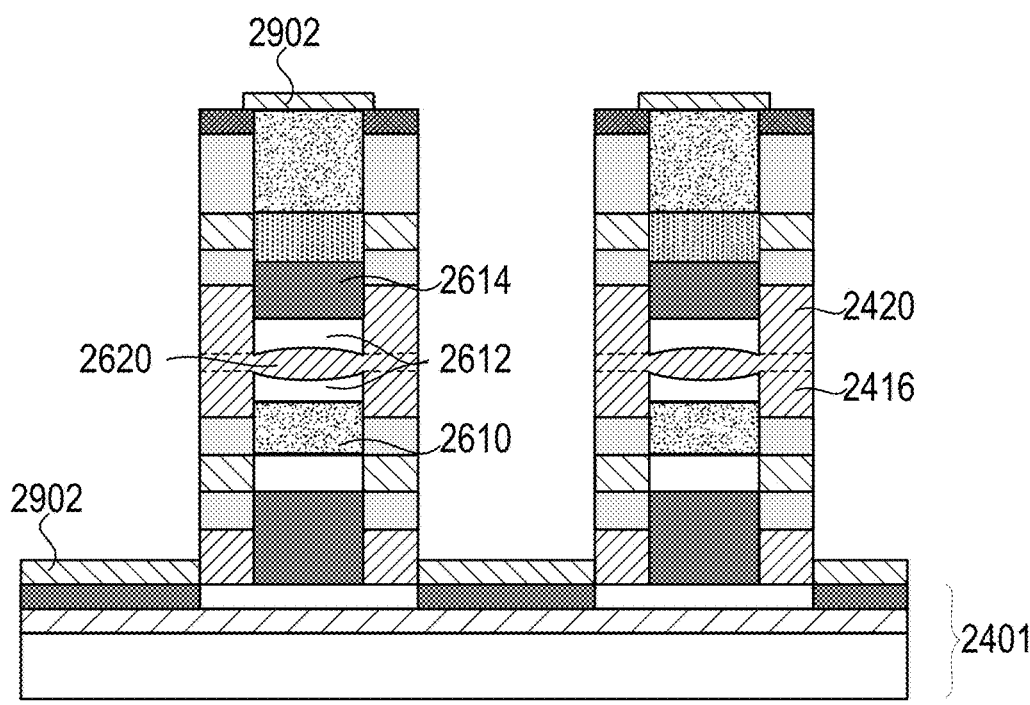

FIG. 30 shows isolation within the vertical channel (or epi stack) of semiconductor material by forming a dielectric to isolate the vertical channel (or epi stack) into two channels. As shown in FIG. 30, a 3D isolation structure 2620 can be formed to extend through the middle layer 2612. The 3D isolation structure 2620 can be made of a same dielectric material as the dielectric material applied to form the dielectric layers 2416 and 2420. In addition, the dielectric layer 2418 can be replaced with the dielectric material that is applied to form the 3D isolation structure 2620.

Figure 31:
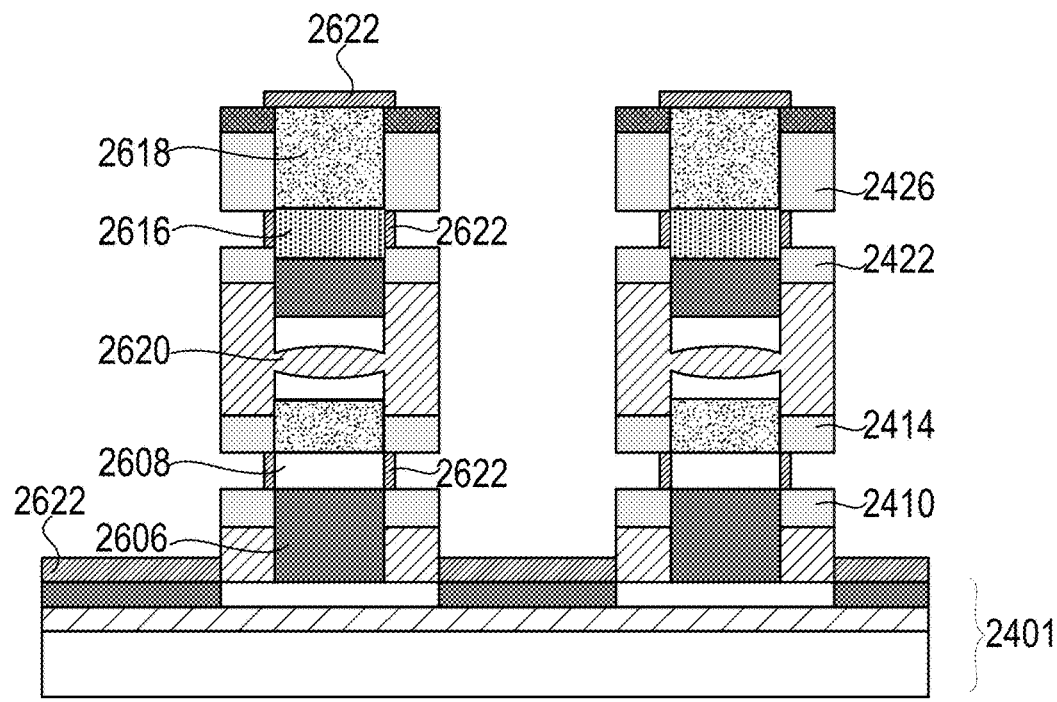

FIG. 31 shows a removal of dielectric layers followed by a high-k dep. As shown in FIG. 31, the dielectric layer 2902, the dielectric layers 2412 and 2424 can be removed and a high-k layer 2622 can be selectively deposited subsequently.

The high-k layer 2622 can be formed selectively over the second P+ epitaxial layer 2618. The high-k layer 2622 can also selectively deposited around the first intrinsic epitaxial layer 2608 and the second intrinsic epitaxial layer 2616. The high-k layer 2622 can further be disposed on the substrate 2401.

Figure 32:
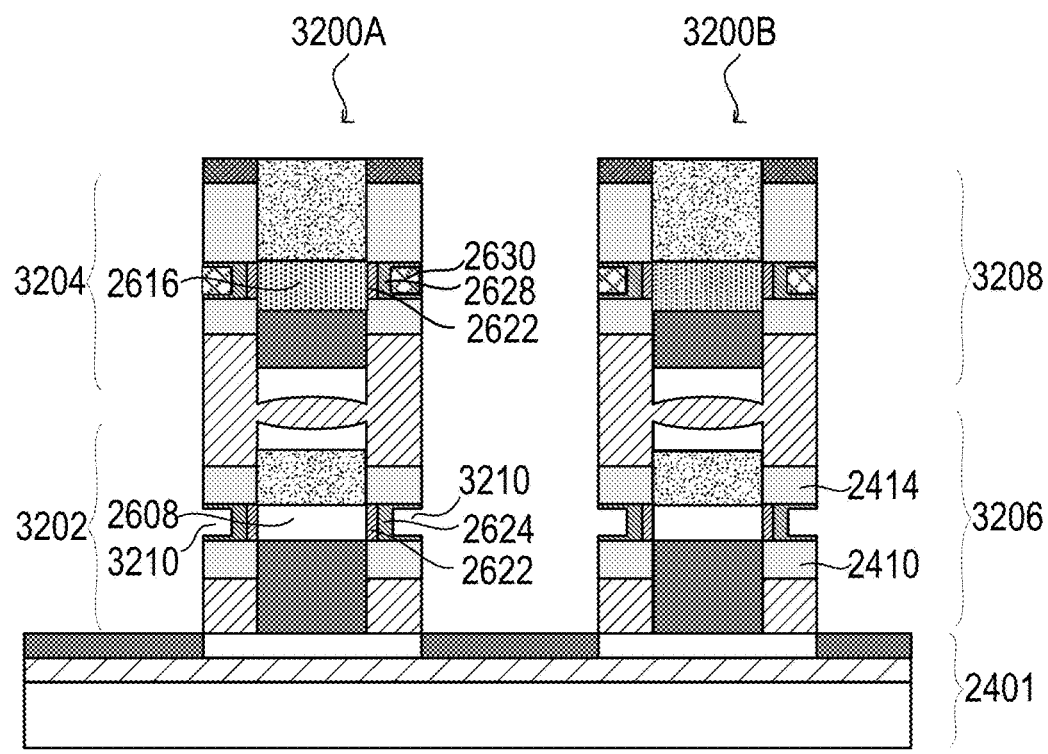

FIG. 32 shows finished gate electrode stacks with two different metal gate stack options, which results in a PMOS (or P-type universal device) over a NMOS (or N-type universal device). As shown in FIG. 32, two stacks of devices 3200A and 3200B are provided. Each of the stacks of devices can include a respective PMOS (or P-type universal device) positioned over a respective NMOS (or N-type universal device). For example, the stack of devices 3200A can include a PMOS/P-type universal device 3204 over a NMOSN-type universal device 3202, and the stack of devices 3200B can include a PMOS/P-type universal device 3208 over a NMOSN-type universal device 3206.

The NMOS/N-type universal device 3202 or 3206 can include a first gate electrode (or gate structure) that include the high-k layer 2622 around the first channel region 08, a first transition stack 2624 over the high-k layer 2622 and around the first channel region 2608. The first transition stack 2624 can include TiN, TaN, or the like. It should be noted that a first metal stack is not deposited over the first transition stack 2624 in FIG. 32. Thus, a gap 3210 can be positioned between the dielectric layers 2410 and 2414 and surround the first transition stack 2624.

The PMOS/P-type universal device 3204 or 3208 can include a second a second gate electrode (or gate structure) around the second channel region 2616. The second gate structure can include the high-k layer 2622 around the second channel region 2616, a second transition stack 2628 over the second high-k layer 2622 and around the second channel region 2616, and a second metal stack 2630 over the second transition stack 2628 and around the second channel region 2616. The second transition stack 2628 can include TiN, TaN, or the like. The second metal stack 2630 can include work functions layers that are compatible with PMOS, such as TiC, TiON, AlTiN, AlTiC, AlTiO, or other work function layers. The second metal stack 2630 can also include one or more liners (e.g., TiN) and a gate fill layer that can be made of tungsten, ruthenium, cobalt, or the like.

Figure 33:
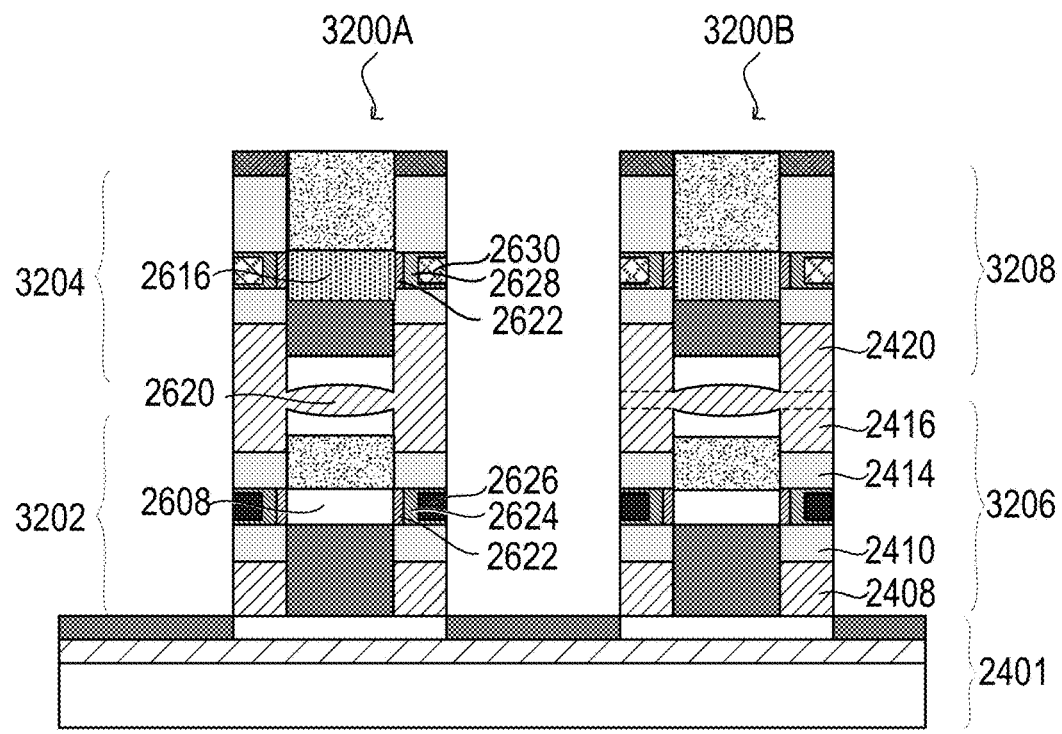

FIG. 33 shows a metal deposition followed by etching to fill in NMOS/N-type universal device. The metal can be Ru, W, Mo, or other compatible metals for work functions of the NMOS/N-type universal device. As shown in FIG. 33, a metal layer can be deposited to fill in the gap 3210 so that a first metal stack 2626 can be formed over the first transition stack 2624 and around the first channel region 2608. The first metal stack 2626 can also include work function layers that are compatible with NMOS, such as TiC, AlTiC, AlTiO, or other suitable work function layers. The work function layer can be in contact with the first transition stack 2624. The first metal stack 2626 can also include one or more liners (e.g., TiN) that are positioned between the metal layer and the work function layers.

Figure 34:
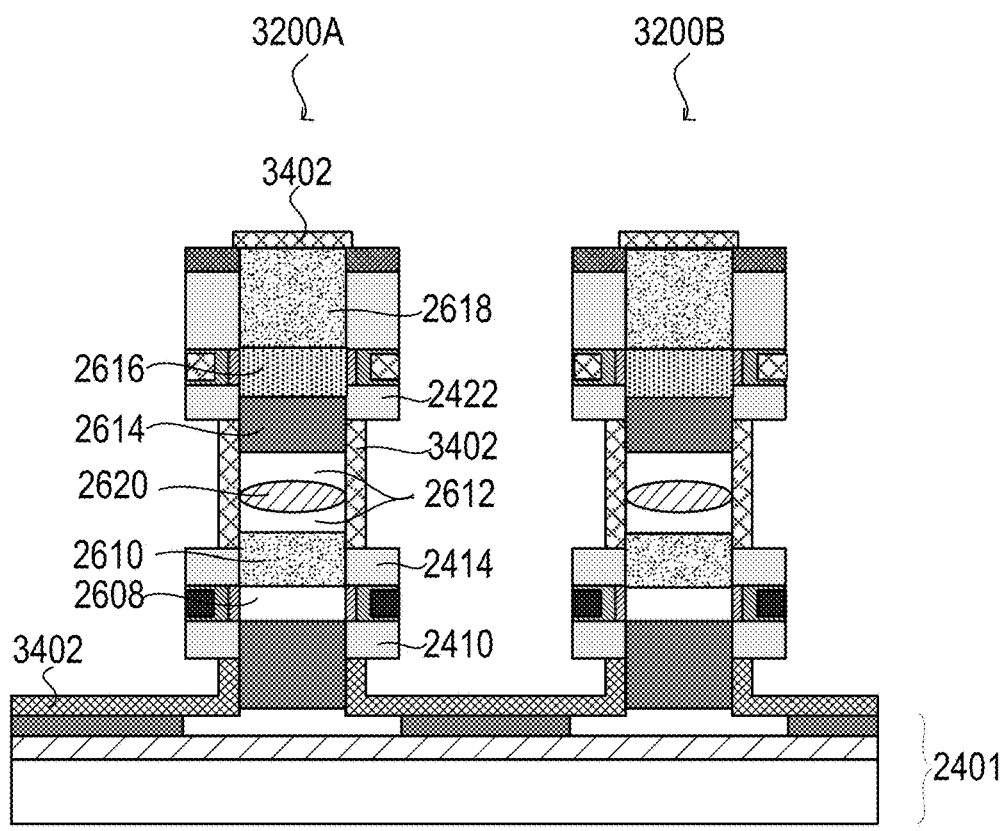

FIG. 34 shows a removal of dielectric layers followed by a silicide formation on uncovered silicon regions followed by a dielectric deposition and an etch. Note a Vout region of the inverter channel can be strapped with a silicide layer. As shown in FIG. 34, the dielectric layers 2408, 2416, and 2420 can be removed. Subsequently, a silicide layer 3402 can be selectively deposited on the second P+ epitaxial layer 2618, and uncovered regions of the substrate. The silicide layer 3402 can be formed between the dielectric layers 2414 and 2422. The silicide layer 3402 can further be disposed around the first P+ epitaxial layer 2610, the middle layer 2612, and the second N+ epitaxial layer 2614. Thus, the first P+ epitaxial layer 2610 and the second N+ epitaxial layer 2614 can be connected to each other.

In accordance with some embodiments of the present disclosure, the silicide layer can include nickel silicide, titanium silicide, cobalt silicide, or the like. The thickness of silicide regions may be in the range between about 2 nm and about 8 nm.

An ILD 2632 can be formed to fill gaps between the two stacks of universal devices 3200A and 3200B. The ILD 2632 can include SiO, SiN, SiON, SiCN, the like, or a combination thereof. Further, a patterning process can be applied to form a plurality of interconnect openings (not shown) in the ILD 2632. The interconnect openings can uncover the S/D regions, and gate structures of the devices in FIG. 34. The patterning process can include a photolithography process and an etching process. The photolithography process can form a photoresist layer with patterns overlying the ILD 2632. The etching process can further transfer the patterns of the photoresist layer into the ILD 2632 to form the plurality of interconnection openings. A metal layer can subsequently be deposited into the interconnect openings to form a plurality of interconnect structures. The interconnect structures can be connected to the S/D regions and gate structures of the devices in FIG. 34. Bias voltages can thus be applied on the S/D regions and gate structures of the devices through the interconnect structures.

Figure 35:
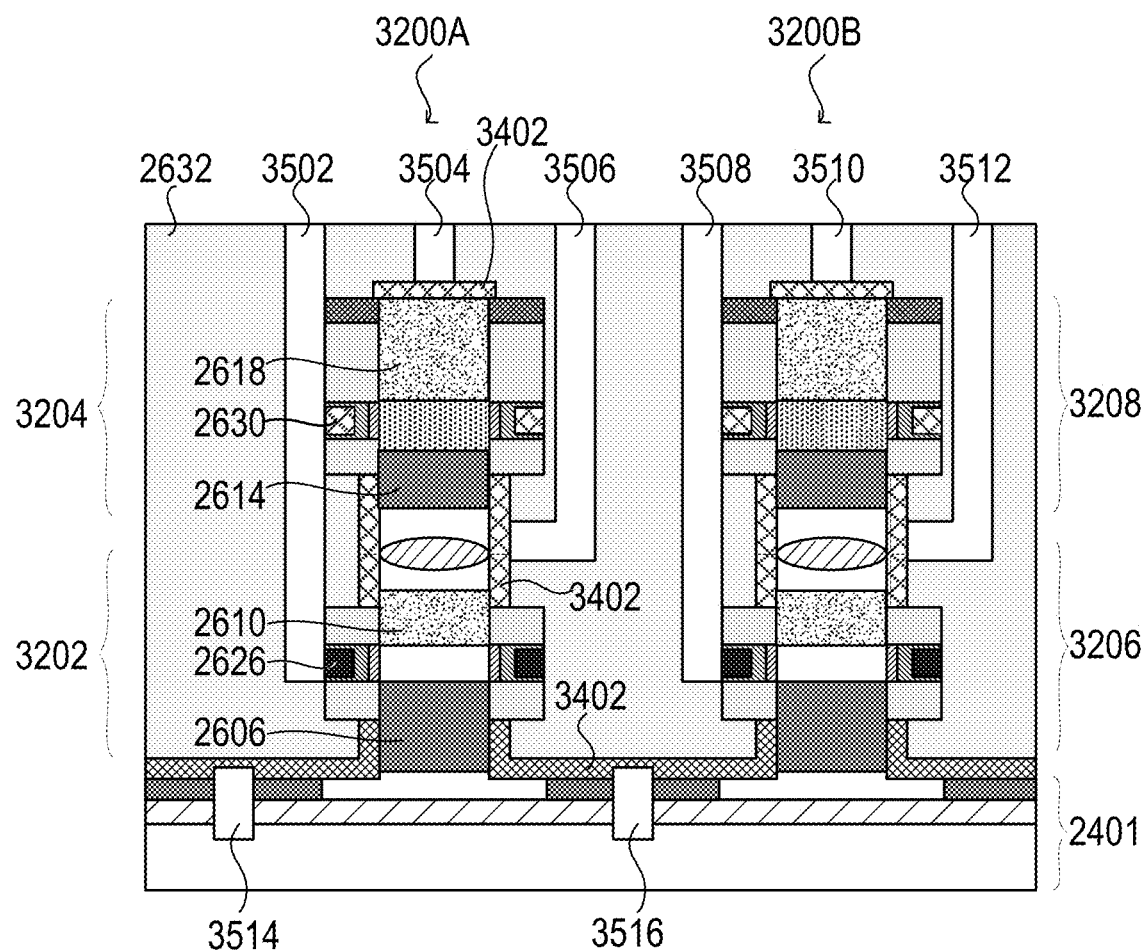

FIG. 35 shows a cross section with completed metal connections (or interconnect structures) to source, drain and gate, and power. As shown in FIG. 35, a first interconnect structure 3502 can be connected to the first gate electrode of the NMOS/N-type universal device 3202 and the second gate electrode of the PMOS/P-type universal device 3204. A second interconnect structure 3504 can be connected to the second P+ epitaxial layer 2618 which can function as a drain terminal of the PMOS/P-type universal device 3204. A third interconnect structure 3506 can be coupled to the first P+ epitaxial layer 2610 of the NMOSN-type universal device 3202, and the second N+ epitaxial layer 2614 of the PMOS/P-type universal device 3204 through the silicide layer 3402. The first P+ epitaxial layer 2610 can function as a drain terminal of the NMOS/N-type universal device 3202, and the second N+ epitaxial layer 2614 can function as a source terminal of the PMOS/P-type universal device 3204, according to the applied bias voltage. Further, a fourth interconnect structure 3514 can be coupled to the first N+ epitaxial layer 2606 of the NMOS/N-type universal device 3202 through the silicide layer 3402. The first N+ epitaxial layer 2606 can function as a source terminal of the NMOS/N-type universal device 3202.

In an embodiment of FIG. 35, an input voltage Vin can be applied to the first interconnect structure 3502, a drain supply voltage Vdd can be applied to the second interconnect structure 3504, an output voltage Vout can be applied to the third interconnect structure 3506, and a source supply voltage Vss can be applied to the fourth interconnect structure 3514. Thus, an inventor can be implemented based on the PMOS/P-type universal device 3204 and the NMOS/N-type universal device 3202 according to the above applied voltages.

Similarly, an input voltage Vin can be applied to the interconnect structure 3508, a Vdd can be applied on the interconnect structure 3510, a Vout can be applied to the interconnect structure 3512, and a Vss can be applied to the interconnect structure 3516. Accordingly, another inventor can be formed based on the PMOS/P-type universal device 3208 and the NMOS/N-type universal device 3206 according to the above applied voltages.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device comprising:
a first universal device including a first source/drain (S/D) region, a first channel region over the first S/D region, a second S/D region over the first channel region, and a first gate structure positioned between the first SID region and the second S/D region and around the first channel region;
a second universal device formed over and spaced apart from the first universal device, the second universal device including a third S/D region positioned over the second S/D region of the first universal device, a second channel region over the third S/D region, a fourth S/D region over the second channel region, and a second gate structure positioned between the third S/D region and the fourth S/D region and around the second channel region; and
an isolation structure positioned between the second S/D region of the first universal device and the third S/D region of the second universal device to isolate the second S/D region of the first universal device and the third S/D region of the second universal device from being in contact with each other, wherein:
the first universal device is one of a first n-type transistor according to first applied bias voltages, and a first p-type transistor according to second applied bias voltages, and
the second universal device is one of a second n-type transistor according to third applied bias voltages, and a second p-type transistor according to fourth applied bias voltages.

2. The semiconductor device of claim 1, wherein:
the first universal device is formed over a substrate,
the first channel region is formed over the substrate and further positioned parallel to a top surface of the substrate such that a first current flowing through the first channel region is perpendicular to the top surface; of the substrate, and
the second channel region is further positioned parallel to the top surface of the substrate such that a second current flowing through the second channel region is perpendicular to the top surface of the substrate.

3. The semiconductor device of claim 1, wherein:
the first S/D region and the third S/D region are made of a same n-type epitaxial material,
the second S/D region and the fourth S/D region are made of a same p-type epitaxial material, and
the first channel region and the second channel region are made of a same intrinsic epitaxial material.

4. The semiconductor device of claim 1, wherein:
the first gate structure includes a first high-k layer positioned around the first channel region, a first transition stack positioned over the first high-k layer and around the first channel region, and a first metal stack disposed over the first transition stack and around the first channel region, and
the second gate structure includes a second high-k layer positioned around the second channel region, a second transition stack positioned over the second high-k layer and around the second channel region, and a second metal stack disposed over the second transition stack and around the second channel region, wherein:
the first high-k layer and the second high-k layer are made of a same high-k material,
the first transition stack and the second transition stack are made of same transition layers, and
the first metal stack the second metal stack are made of different metal layers.

5. The semiconductor device of claim 1, wherein:
the first gate structure includes a first high-k layer positioned around the first channel region, a first transition stack positioned over the first high-k layer and around the first channel region, and a first metal stack disposed over the first transition stack and around the first channel region, and
the second gate structure includes a second high-k layer positioned around the second channel region, a second transition stack positioned over the second high-k layer and around the second channel region, and a second metal stack disposed over the second transition stack and around the second channel region, wherein:
the first high-k layer and the second high-k layer are made of a same high-k material,
the first transition stack and the second transition stack are made of same transition layers, and the first metal stack the second metal stack are made of same metal layers.

6. A semiconductor device comprising:
a universal device including a first source/drain (S/D) region, a first channel region over the first S/D region, a second S/D region over the first channel region, and a first gate structure positioned between the first S/D region and the second S/D region and around the first channel region;
a transistor formed over and spaced apart from the universal device, the transistor including a third S/D region positioned over the second S/D region of the universal device, a second channel region over the third S/D region, a fourth S/D region over the second charnel region, and a second gate structure positioned between the third S/D region and the fourth S/D region and around the second channel region; and
an isolation structure positioned between the second S/D region of the universal device and the third S/D region of the transistor to isolate the second S/D region of the universal device and the third S/D region of the transistor from being in contact with each other, wherein:
the universal device is one of a n-type transistor according to first applied bias voltages, and a p-type transistor according to second applied bias voltages.

7. The semiconductor device of claim 6, wherein:
the first S/D region is made of a n-type epitaxial material,
the second S/D region, the third S/D region, and the fourth S/D region are made of a same p-type epitaxial material, and
the first channel region and the second channel region are made of a same intrinsic epitaxial material.

8. The semiconductor device of claim 6, wherein:
the first S/D region is made of a p-type epitaxial material,
the second S/D region, the third S/D region, and the fourth S/D region are made of a same n-type epitaxial material, and
the first channel region and the second channel region are made of a same intrinsic epitaxial material.

9. The semiconductor device of claim 6, wherein:
the first gate structure includes a first high-k layer positioned around the first channel region, a first transition stack positioned over the first high-k layer and around the first channel region, and a first metal stack disposed over the first transition stack and around the first channel region, and
the second gate structure includes a second high-k layer positioned around the second channel region, a second transition stack positioned over the second high-k layer and around the second channel region, and a second metal stack disposed over the second transition stack and around the second channel region, wherein:
the first high-k layer and the second high-k layer are made of a same high-k material,
the first transition stack and the second transition stack are made of same transition layers, and
the first metal Mack the second metal stack are made of different metal layers.

10. A semiconductor device comprising:
a first universal device including a first source/drain (S/D) region, a first channel region over the first S/D region, a second S/D region over the first channel region, and a first gate structure positioned between the first S/D region and the second S/D region and around the first channel region;
a second universal device formed over and spaced apart from the first universal device, the second universal device including a third S/D region over the second S/D region of the first universal device, a second channel region over the third S/D region, a fourth S/D region over e second channel region, and a second gate structure positioned between the third S/D region and the fourth S/D region and around the second channel region;
an isolation structure positioned between the second S/D region of the first universal device and the third S/D region of the second universal device to isolate: the second S/D region of the first universal device and the third S/D region of the second universal device from being in contact with each other; and
a salicide layer positioned between the first gate structure and the second gate structure, and further around the second S/D region and the third S/D region so that the second S/D region is coupled to the third S/D region, wherein:
the first universal device is one of a first n-type transistor according to first applied bias voltages, and a first p-type transistor according to second applied bias voltages, and
the second universal device is one of a second n-type transistor according to third applied bias voltages, and a second p-type transistor according to fourth applied bias voltages.

11. The semiconductor device of claim 10, wherein:
the first S/D region and the third S/D region are made of a same n-type epitaxial material, and
the second S/D region and the fourth S/D region are made of a same p-type epitaxial material.

12. The semiconductor device of claim 10, wherein:
the first channel region is made of a first intrinsic epitaxial material, and
the second channel region is made of a second intrinsic epitaxial material.

13. The semiconductor device of claim 10, wherein:
the first gate structure includes a first high-k layer positioned around the first channel region, a first transition stack positioned over the first high-k layer and around the first channel region, and a first metal stack disposed over the first transition stack and around the first channel region, and
the second gate structure includes a second high-k layer positioned around the second channel region, a second transition stack positioned over the second high-k layer and around the second channel region, and a second metal stack disposed over the second transition stack and around the second channel region, wherein:
the first high-k layer and the second high-k layer are made of a same high-k material,
the first transition stack and the second transition stack are made of same transition layers, and
the first metal stack the second metal stack are made of different metal lavers.

14. A method of manufacturing a semiconductor device, comprising:
forming a stack of dielectric layers on a first layer of a semiconductor substrate, the stack of dielectric layers including layers made of at least three different dielectric materials with respective etch selectivity, an intermediate layer of the layers being made of one of the at least three different dielectric materials and disposed in a middle position of the stack of dielectric layers;
forming an opening in the stack of dielectric layers such that the first layer of the semiconductor substrate is uncovered;

epitaxially growing, within the opening, a channel material stack to form a vertical channel that extends from the first layer of the semiconductor substrate;

etching the stack of dielectric layers to form a sidewall structure disposed along sidewalls of the vertical channel, the sidewall structure being formed of the layers of the at least three different dielectric materials;

dividing the vertical channel into a lower channel and an upper channel that are isolated from one another; and forming a lower universal device based on the lower channel and an upper universal device based on the upper channel, wherein:

the lower universal device is one of a first n-type transistor according to first bias voltages, and a first p-type transistor according to second bias voltages, and the upper universal device is one of a second n-type transistor according to third bias voltages, and a second p-type transistor according to fourth bias voltages.

15. The method of claim 14, wherein the epitaxially growing the channel material stack comprises:

forming a first source/drain (S/D) region over the first layer of the semiconductor substrate;

forming a first region over the first S/D region;

forming a second S/D region over the first channel region;

forming an intrinsic layer over the second S/D region, the intrinsic layer being surrounded by the intermediate layer;

forming a third S/D region over the intrinsic layer;

forming a second channel region over the third S/D region; and forming a fourth S/D region over the second channel region.

16. The method of claim 15, wherein the etching the stack of dielectric layers further comprising:

forming a trench in the stack of dielectric layers around the vertical channel, wherein:

the trench uncovers the first layer of the semiconductor substrate and forms the sidewall structure disposed along the sidewalls of the vertical channel, and the vertical channel is surrounded by the sidewall structure.

17. The method of claim 16, wherein the dividing the vertical channel further comprises:

forming an isolation structure by replacing the intermediate layer with the isolation structure in the sidewall structure, the isolation structure further extending through the intrinsic layer of the vertical channel to separate the vertical channel into the lower channel and the upper channel, wherein:

the lower channel includes the first S/D region, the first channel region, and the second S/D region, and the upper channel includes the third S/D region, the second channel region, and the fourth S/D region.

18. The method of claim 17, wherein the forming the lower universal device based on the lower channel and the upper universal device based on the upper channel further comprises:

removing a first dielectric layer of the layers that is disposed around the first channel region, and a second dielectric layer of the layers that is disposed around the second channel region;

forming a first gate structure around the first channel region, the first gate structure including a first high-k layer around the first channel region, a first transition stack over the first high-k layer and around the first channel region, and a first metal stack over the first transition stack and around the first channel region; and forming a second gate structure around the second channel region, the second gate structure including a second high-k layer around the second channel region, a second transition stack over the second high-k layer and around the second channel region, and a second metal stack over the second transition stack and around the second channel region, wherein:

the first high-k layer and the second high-k layer are made of a same high-k material, the first transition stack and the second transition stack are made of same transition layers, and the first metal stack the second metal stack are made of different metal layers.

19. The method of claim 15, wherein:

the first S/D region and the third S/D region are made of a same n-type epitaxial material, the second S/D region and the fourth S/D region are made of a same p-type epitaxial material, and the first channel region and the second channel region are made of a same intrinsic epitaxial material.

* * * * *

UNITED STATES PATENT AND TRADEMARK OFFICE
CERTIFICATE OF CORRECTION

PATENT NO. : 11,652,139 B2
APPLICATION NO. : 17/328601
DATED : May 16, 2023
INVENTOR(S) : Gardner et al.

It is certified that error appears in the above-identified patent and that said Letters Patent is hereby corrected as shown below:

In the Claims

In Column 20, Claim 2, Line 19, delete "surface;" and insert -- surface --, therefor.

In Column 21, Claim 6, Line 14, delete "charnel" and insert -- channel --, therefor.

In Column 21, Claim 9, Line 57, delete "Mack" and insert -- stack --, therefor.

In Column 22, Claim 10, Line 4, delete "e" and insert -- the --, therefor.

In Column 22, Claim 10, Line 10, delete "isolate:" and insert -- isolate --, therefor.

In Column 23, Claim 15, Line 23, before "region", insert -- channel --.

Signed and Sealed this
Thirteenth Day of February, 2024

Katherine Kelly Vidal
*Director of the United States Patent and Trademark Office*